(12) United States Patent
Hatanaka et al.

(10) Patent No.: US 7,266,869 B2
(45) Date of Patent: Sep. 11, 2007

(54) METHOD FOR MANUFACTURING A PIEZOELECTRIC OSCILLATOR

(75) Inventors: Hidefumi Hatanaka, Kagoshima (JP); Ryoma Sasagawa, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 129 days.

(21) Appl. No.: 10/900,977

(22) Filed: Jul. 27, 2004

(65) Prior Publication Data

US 2005/0055814 A1    Mar. 17, 2005

(30) Foreign Application Priority Data

Jul. 30, 2003   (JP)   .............. 2003-204143
Jul. 30, 2003   (JP)   .............. 2003-204150
Aug. 28, 2003  (JP)   .............. 2003-304803

(51) Int. Cl.
  *H04R 17/00*    (2006.01)
  *H01L 41/04*    (2006.01)

(52) U.S. Cl. .................. 29/25.35; 29/412; 29/417; 29/830; 29/831; 29/832; 310/313 R

(58) Field of Classification Search ............... 29/25.35, 29/830, 412, 417, 832, 831, 413, 827, 825, 29/317, 318, 320, 313 A; 310/313 R, 344, 310/348, 313 B, 313 D, 320, 313 A, 317, 310/318; 430/313 R, 344, 348, 313 B, 313 D
See application file for complete search history.

(56) References Cited

U.S. PATENT DOCUMENTS

| | | | |
|---|---|---|---|
| 5,502,344 A | | 3/1996 | Yoshimoto et al. |
| 5,506,463 A | | 4/1996 | Yoshimoto et al. |
| 5,548,091 A | * | 8/1996 | DiStefano et al. .......... 174/260 |
| 5,611,129 A | * | 3/1997 | Yoshimoto et al. ........ 29/25.35 |
| 5,612,513 A | * | 3/1997 | Tuttle et al. ................. 174/260 |
| 5,631,609 A | * | 5/1997 | Oka et al. ...................... 331/68 |
| 5,705,957 A | | 1/1998 | Oka et al. |
| 5,759,753 A | * | 6/1998 | Namba et al. .............. 438/456 |
| 5,981,314 A | * | 11/1999 | Glenn et al. ................. 438/127 |
| 5,990,545 A | * | 11/1999 | Schueller et al. ........... 257/697 |
| 6,229,404 B1 | * | 5/2001 | Hatanaka ...................... 331/68 |

FOREIGN PATENT DOCUMENTS

| | | |
|---|---|---|
| CN | 1136727 A | 11/1996 |
| JP | 07273578 A | 10/1995 |

(Continued)

OTHER PUBLICATIONS

Japanese Unexamined Patent Publication No. 2003-101348 with it's corresponding U.S. Patent No. 6,720,837.

(Continued)

*Primary Examiner*—A. Dexter Tugbang
*Assistant Examiner*—Tai Van Nguyen
(74) *Attorney, Agent, or Firm*—Hogan & Hartson LLP

(57) ABSTRACT

A method for manufacturing a piezoelectric oscillator. The method having the step of preparing a master substrate partitioned into plural substrate regions. Mounting on each of the substrate regions a piezoelectric vibrator and an IC for controlling an oscillation output of the piezoelectric vibrator. The master substrate is then divided into individual substrate regions by cutting the master substrate on the outside circumferences of the individual substrate regions, thereby obtaining a plurality of piezoelectric oscillators.

9 Claims, 20 Drawing Sheets

FOREIGN PATENT DOCUMENTS

| | | |
|---|---|---|
| JP | 07-099413 | 11/1995 |
| JP | 09018234 A | 1/1997 |
| JP | 10-022735 | 1/1998 |
| JP | 11186850 A | 7/1999 |
| JP | 2000-151283 | 5/2000 |
| JP | 2003-101348 | 4/2004 |

OTHER PUBLICATIONS

Japanese Unexamined Patent Publication No. 2000-151283 with it's corresponding U.S. Patent No. 6,229,249.

Chinese language Office Action for corresponding Chinese Application No. 2004100587271 list references above.

* cited by examiner

AP : APERTURE

AP : APERTURE

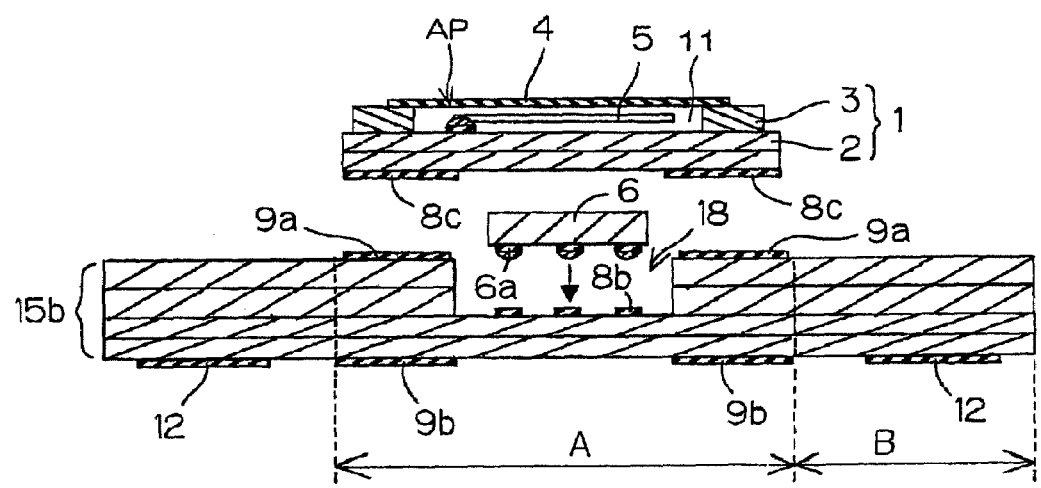
FIG. 24 (AMENDED)

METHOD FOR MANUFACTURING A PIEZOELECTRIC OSCILLATOR

BACKGROUND OF THE INVENTION

1. Field of the Invention

The present invention relates to a method for manufacturing a piezoelectric oscillator for use in electronic apparatuses such as portable communication units.

2. Description of the Related Art

Electronic apparatuses such as portable communication units have conventionally employed piezoelectric oscillators such as a temperature-compensated quartz-crystal oscillator.

As such a conventional piezoelectric oscillator, there is known one shown in FIG. 26 and FIG. 27, for example. The oscillator includes a substrate 21 having a plurality of external terminals 22 on a lower side thereof and a recess 25 on an upper side thereof, and is constructed such that a quartz-crystal oscillator device 24 and an IC 26 for controlling an oscillation output of the quartz-crystal oscillator device 24 are accommodated in the recess 25, and that an aperture of the recess 25 is hermetically sealed with a closure 27.

The substrate 21 of such a piezoelectric oscillator 21 is normally formed using a "batch processing" method wherein a large substrate formed from a ceramic material such as alumina ceramics is divided into pieces so as to obtain plural substrates 21 at a time. The IC 26 and the quartz-crystal oscillator device 24 are sequentially mounted/accommodated in the respective recesses 25 of the individual substrates 21 thus obtained by dividing the large substrate. Subsequently, the closure 27 is fixed to the respective recesses 25 on the upper sides of the substrates 21 by seam welding or the like conventionally known in the art in a manner to close the respective apertures of the recesses 25. In this manner, the conventional piezoelectric oscillators are manufactured.

The IC 26 incorporates therein a temperature compensating circuit for compensating for the oscillation output of the piezoelectric oscillator based on temperature compensation data generated based on temperature characteristics of the quartz-crystal oscillator device 24. Hence, a write control terminal 28 for inputting the temperature compensation data is provided on a lateral side or the like of the substrate 21 such as to allow the aforesaid temperature compensation data to be stored in a memory in the IC 26 after the assembly of the piezoelectric oscillator.

Unfortunately, the conventional manufacturing method as described above has the following problem. According to this method, after the large ceramic substrate is divided into pieces (substrates 21), the quartz-crystal oscillator device 24 and the IC 26 are mounted in the respective recesses 25 of the substrates 21 and then, the closure 27 is assembled to the respective substrates. In this case, the mounting operations of the quartz-crystal oscillator device 24 and of the IC 26 and the operation of assembling the closure 27 require each substrate 21 to be positively fixed as retained by a carrier in order to ensure that the quartz-crystal oscillator device 24 and the IC 26 are precisely mounted on the substrate and that the closure 27 is precisely assembled to the substrate.

Therefore, the conventional manufacturing method as described above requires additional facilities for manufacturing the carrier and the like for fixedly retaining the substrate 21, and also a cumbersome step of loading the substrate on the carrier. This leads to a drawback of lowering the productivity of the piezoelectric oscillator.

Furthermore, the conventional piezoelectric oscillator is provided with the write control terminal 28 at the lateral side or the like of the substrate 21 such as to allow for the input of the temperature compensation data. This dictates the need to provide a space for the write control terminal 28 on the surface of the substrate 2. Thus, the substrate 21 is accordingly increased in the area with respect to the face thereof or the thickness thereof, thus constituting an obstacle to the size reduction of the whole structure of the oscillator. Where the write control terminal 28 is disposed on the lateral side of the substrate 21, complicated processes must be done, which include: forming through-holes in the large ceramic substrate used for manufacturing the substrates 21; depositing an electrode pattern on an inside surface of each through-hole; and such. This results in a lowered productivity.

On the other hand, the mounting of the piezoelectric oscillator on an external circuit board involves fear that some of a conductive bonding material used for bonding the piezoelectric oscillator to the external circuit board may be adhered to the write control terminal 28, causing the piezoelectric oscillator to short with the external terminal. This leads to a drawback of cumbersome handling of the product.

In addition, the following problem also exists. Since it is difficult to perform the writing operation with a probe of a write device held in contact with the write control terminal 28 on the lateral side of the substrate, the following procedure is taken. That is, a socket dedicated to the writing of the temperature compensation data is prepared. Each piezoelectric oscillator need be mounted to the socket so as to permit the writing of the temperature compensation data. This requires not only additional facilities for manufacturing the socket and the like, but also a cumbersome step of mounting each piezoelectric oscillator to the socket. As a result, the manufacturing process is complicated.

It is an object of the invention to provide a method for manufacturing a piezoelectric oscillator which provides a compact piezoelectric oscillator featuring easy handling and high productivity.

BRIEF SUMMARY OF THE INVENTION

A method for manufacturing a piezoelectric oscillator according to the invention comprises the steps of: preparing a master substrate partitioned into plural substrate regions; mounting, on each of the substrate regions, a piezoelectric vibrator and an IC for controlling an oscillation output of the piezoelectric vibrator; and dividing the master substrate into the individual substrate regions by cutting the master substrate on outside circumferences of the individual substrate regions, thereby obtaining a plurality of piezoelectric oscillators.

According to the method, the IC and the piezoelectric vibrator are mounted on/accommodated in each of the substrate regions of the master substrate and thereafter, the master substrate is divided by cutting thereby to obtain the plural piezoelectric oscillators. During the assembly of the piezoelectric oscillator, therefore, the master substrate itself is allowed to function as a carrier for IC mounting, a carrier for piezoelectric-vibrator mounting, and a carrier for closure mounting. This negates the need for the manufacturing facilities of the carriers and the like used for fixing the individual substrates or for the cumbersome step of loading, on the carriers, the individual pieces obtained by dividing the master substrate. Thus, the piezoelectric oscillator can be improved in the productivity.

It is preferred that the prepared master substrate is provided with a throw-away region between a respective pair of adjoining substrate regions, the throw-away region including a write control terminal, and that the method comprises an additional step of writing temperature compensation data to a memory in the IC via the write control terminal, the data used for controlling the oscillation output of the piezoelectric vibrator based on temperature conditions thereof, the step performed after the piezoelectric vibrator and the IC for controlling the oscillation output of the piezoelectric vibrator are mounted on each of the substrate regions. This approach eliminates the necessity of providing a large space on the lateral side or the like of the substrate in order to dispose the write control terminal. Hence, the whole structure of the piezoelectric oscillator may be downsized. Furthermore, none of the equipments such as a socket for inputting the temperature compensation data to the individual piezoelectric oscillators is necessary, so that the piezoelectric oscillator may maintain the high productivity. In addition, the piezoelectric oscillator obtained by the manufacturing method of the invention is free from the write control terminal, as mentioned supra. When the piezoelectric oscillator is mounted on an external circuit board, therefore, there is no fear of such a trouble that some of the conductive bonding material used for bonding the piezoelectric oscillator to the external circuit board is adhered to the write control terminal, causing the oscillator to short with the terminal. This leads to an easy handling of the product.

It is preferred in the writing step that an electrode terminal connected with the IC is electrically connected with the write control terminal via a wiring conductor through the master substrate or that, in a case where a package (to be described hereinlater) is used, the electrode terminal and the write control terminal are electrically interconnected via the wiring conductor through the master substrate and a wiring conductor through the package. Such an arrangement eliminates the need for an external cable for interconnecting the electrode terminal connected with the IC, and the write control terminal. This leads to an increased efficiency of the data writing operation and hence, the piezoelectric oscillator may maintain the high productivity.

According to the method for manufacturing the piezoelectric oscillator of the invention, a recess may be formed in each of the substrate regions of the master substrate, the piezoelectric vibrator and the IC may be accommodated in the recess in each of the substrate regions and thereafter, an aperture of the recess may be closed with a closure. This method provides an easy hermetical sealing of the piezoelectric vibrator and the IC, such that the deterioration of the devices may be prevented.

Furthermore, a seal ring may be seated on/fixed to a periphery of the recess in a manner to enclose a peripheral area of the aperture of the recess, so as to accommodate therein the piezoelectric vibrator and the IC. Subsequently, an opening of the seal ring may be closed with the closure.

Instead of directly mounting the piezoelectric vibrator on each of the substrate regions of the master substrate, the package for accommodating therein the piezoelectric vibrator may be mounted on the master substrate. This approach allows the piezoelectric vibrator to be accommodated in a recess of the package.

In a case where the package is mounted, the package may be formed from a ceramic material excellent in workability and sealing performance, whereas the master substrate may be formed from a resin material featuring good workability during cutting, and easy handling. Thus, the piezoelectric oscillator having a high reliability may be manufactured quite efficiently.

BRIEF DESCRIPTION OF THE DRAWINGS

FIG. 22 through FIG. 25 are sectional views each illustrating another manufacturing method of the invention or a piezoelectric oscillator having another structure;

DETAILED DESCRIPTION OF THE INVENTION

The invention will hereinbelow be described in details with reference to the accompanying drawings.

Figure 1:
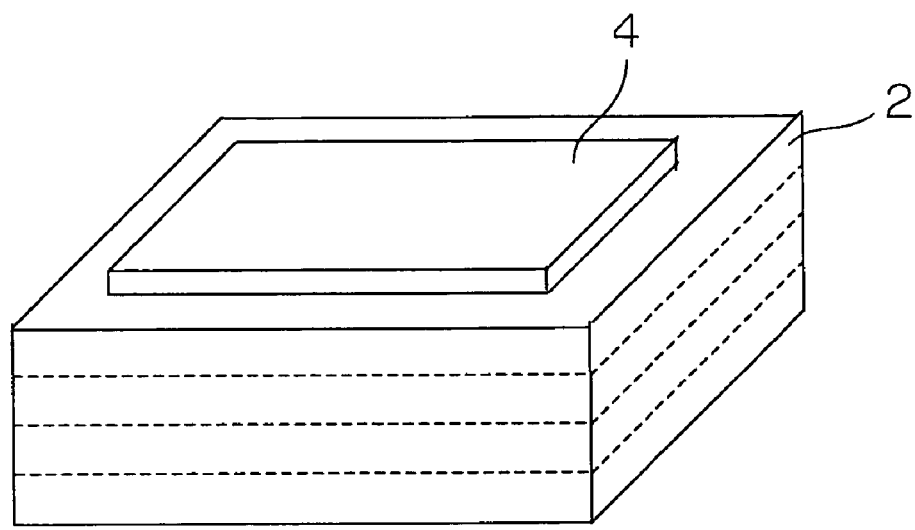
FIG. 1 is a perspective view showing a piezoelectric oscillator manufactured by a manufacturing method according to the invention.
Figure 2:
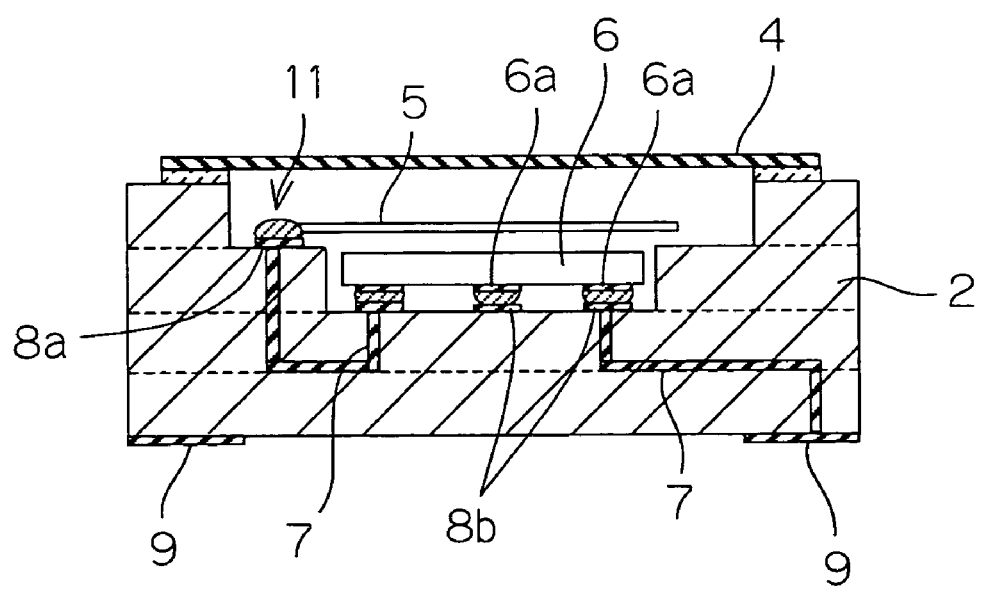
FIG. 2 is a sectional view of the piezoelectric oscillator of FIG. 1.

FIG. 1 is a perspective view showing a piezoelectric oscillator manufactured by a manufacturing method according to the invention. FIG. 2 is a sectional view of the piezoelectric oscillator.

The piezoelectric oscillator shown in these figures has a structure wherein a recess 11 is formed on an upper side of a substrate 1 and wherein a peripheral area of an aperture of the recess 11 is closed with a closure 4. The recess 11 is constructed in two steps. A deep recess portion on the relatively inner side accommodates therein an IC 6, whereas a shallow recess portion on the relatively outer side accommodates therein a quartz-crystal oscillator device 5 as a piezoelectric vibrator.

First of all, it is noted that the invention is applicable to a case where any of the other piezoelectric vibrators, such as a SAW (Surface Acoustic Wave) device, than the quartz-crystal oscillator device is used for forming the piezoelectric oscillator. The following description is made on assumption that the quartz-crystal oscillator device is used as the piezoelectric vibrator.

The substrate 1 is formed from, for example, a ceramic material such as glass-ceramics, substantially in a rectangular parallelepiped shape. Disposed on a lower side of the substrate 1 are a ground terminal, a source voltage terminal, an oscillation output terminal, an oscillation control terminal and the like (hereinafter, collectively referred to as "external terminals 9") These external terminals 9 are designed to be electrically connected with wirings of external electrical circuits when the piezoelectric oscillator is mounted on an external circuit board.

On an inside surface of the recess 11, there are provided a pair of mounting pads 8a connected with oscillation electrodes of the quartz-crystal oscillator device 5, electrode pads 8b connected with connection pads 6a of the IC 6, and the like, the pads located at predetermined positions. The respective pairs of corresponding pads are electrically and mechanically connected with each other by way of a conductive bonding material such as a solder. In this manner, the quartz-crystal oscillator device 5 and the IC 6 are mounted in the recess 11 at the predetermined positions.

The quartz-crystal oscillator device 5 mounted in the recess 11 is formed by depositing a pair of oscillation electrodes on either main planes of a quartz slice obtained by cutting quartz from a predetermined crystal axis. When an external voltage is applied to the quartz slice via the pair of oscillation electrodes, the quartz slice encounters "thickness shear oscillations" at given frequencies.

On the other hand, the IC 6 disposed in the recess 11 along with the aforesaid quartz-crystal oscillator device 5 employs, for example, a flip-chip type IC. The IC is provided with, on its circuit formation surface, a temperature sensor (thermistor) for sensing the ambient temperatures; a memory for storing temperature compensation data used for compensating for the temperature characteristics of the quartz-crystal oscillator device 5; a temperature compensating circuit operating based on the temperature compensation data thereby compensating for the oscillation characteristics of the quartz-crystal oscillator device 5 according to the temperature variations; an oscillation circuit connected with the temperature compensating circuit so as to generate a predetermined oscillation output; and the like. The oscillation output generated by the oscillation circuit of the IC 6 is outputted externally and then is used as a reference signal such as a clock signal.

The mounting pads 8a and electrode pads 8b disposed in the recess 11 are electrically connected with the external terminals 9 via wiring conductors such as wiring patterns on the substrate surface or within the substrate and a via hole conductor (collectively represented by a reference character 7).

On the other hand, the closure 4 attached to the upper side of the substrate 1 is composed of a metal such as 42 alloy, Kovar, or phosphor bronze. An outside circumference of the closure 4 extends to place outside of the aperture of the recess 11. The extension is welded to the upper side of the substrate 1, thereby hermetically sealing a space defined by the inside surface of the recess 11 and a lower side of the closure 4.

It is preferred that the closure 4 is connected with the ground terminal of the external terminals 9 via the wiring conductor 7 or the like, the external terminals disposed on the lower side of the substrate 1. This connection provides the grounding of the closure 4 so that the closure may have a shielding function during the operation of the piezoelectric oscillator. Accordingly, the quartz-crystal oscillator device 5 and the IC 6 may preferably be protected from unwanted external electrical noises.

According to the structure of the piezoelectric oscillator of the invention as shown in FIG. 2, the IC 6 is accommodated in the deep recess portion on the relatively inner side, whereas the quartz-crystal oscillator device 5 is accommodated in the shallow recess portion on the relatively outer side. Conversely, the piezoelectric oscillator of the invention may also be constructed such that the quartz-crystal oscillator device 5 is accommodated in the deep recess portion on the relatively inner side, whereas the IC 6 is accommodated in the shallow recess portion on the relatively outer side.

The piezoelectric oscillator as described above is free from a write control terminal used for writing the temperature compensation data to the memory in the IC 6.

This is because a throw-away region B provided with the write control terminal 12 is designed to be cut off from a substrate region A defining the substrate 1 in Step C of a manufacturing process to be described hereinlater. This eliminates the necessity of providing an extra space on the lateral side of the substrate 1 or the like in order to dispose the write control terminal. Thus, the whole structure of the piezoelectric oscillator is accordingly reduced in size.

Figure 3:
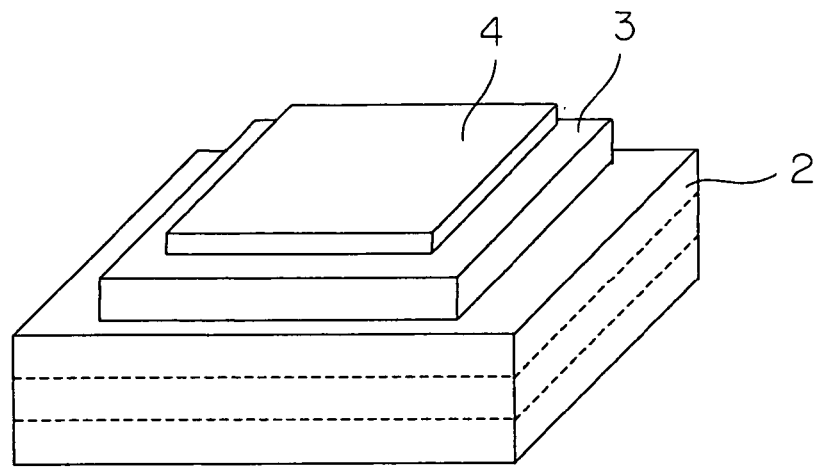
FIG. 3 is a perspective view showing a piezoelectric oscillator manufactured by another manufacturing method of the invention.
Figure 4:
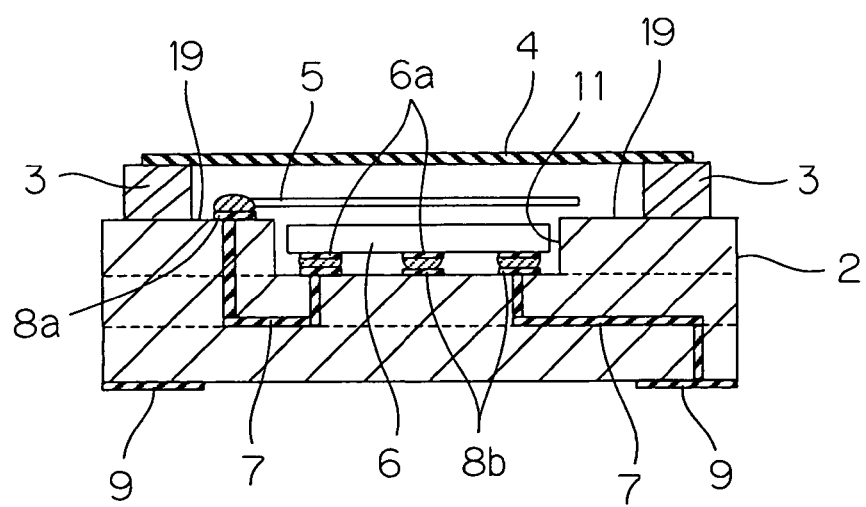
FIG. 4 is a sectional view of the piezoelectric oscillator of FIG. 3.

FIG. 3 is a perspective view showing a piezoelectric oscillator having another structure and manufactured by the manufacturing method of the invention, whereas FIG. 4 is a sectional view thereof.

The piezoelectric oscillator shown in FIG. 3 and FIG. 4 differs from that shown in FIG. 1 and FIG. 2 in that a metallic seal ring 3 is seated on/fixed to the peripheral area of the aperture of the recess 11 accommodating therein the IC 6, so as to accommodate therein the quartz-crystal oscillator device 5, and that the outside circumference of the metallic closure 4 is bonded to an upper side of the seal ring 3. Thus, the piezoelectric oscillator has a structure wherein a space where the quartz-crystal oscillator device 5 and the IC 6 are disposed is hermetically sealed with the seal ring 3 and the closure 4.

The seal ring 3 is formed from, for example, 42 alloy, Kovar, or phosphor bronze. The outside circumference of the closure 4 is bonded (by welding or such) to the upper side of the seal ring 3 thereby hermetically sealing the space where the quartz-crystal oscillator device 5 and the IC 6 are mounted.

For the purpose of grounding the closure 4, the seal ring 3 may preferably be connected with the ground terminal of the external terminals 9 disposed on the lower side of the substrate 1 via the wiring conductor 7 of the substrate 1 or the like.

Figure 5:
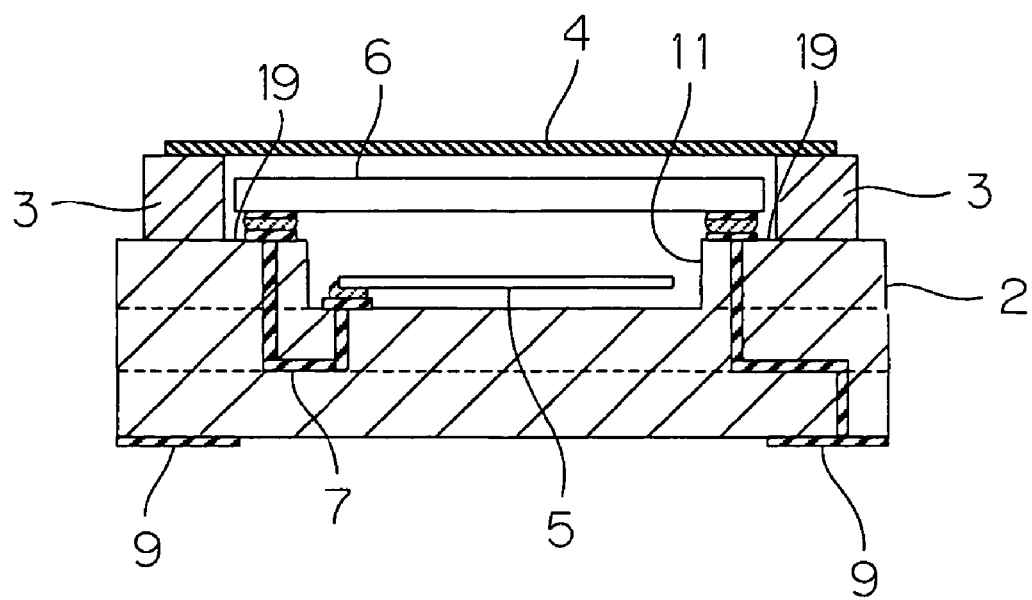
FIG. 5 is a sectional view showing a piezoelectric oscillator manufactured by still another manufacturing method of the invention.

FIG. 5 is a sectional view showing a piezoelectric oscillator having still another structure and manufactured by the manufacturing method of the invention.

In the structure of FIG. 5, as well, the metallic seal ring 3 enclosing the IC 6 is seated on/fixed to the upper side of the substrate 1 to which the quartz-crystal oscillator device 5 and the IC 6 are mounted, whereas the outside circumference of the metallic closure 4 is bonded to the upper side of the seal ring 3. Thus, the space wherein the quartz-crystal oscillator device 5 and the IC 6 are disposed is hermetically sealed with the seal ring 3 and the closure 4.

The piezoelectric oscillator shown in FIG. 5 differs from that shown in FIG. 4 in the following point. In FIG. 4, the IC 6 is accommodated in the recess 11, while the quartz-crystal oscillator device 5 is mounted on the upper side of the substrate 1. Conversely, the structure of FIG. 5 is arranged such that the quartz-crystal oscillator device 5 is accommodated in the recess 11, while the IC 6 is mounted on the upper side of the substrate 1.

Next, the method for manufacturing the piezoelectric oscillators shown in FIG. 1 through FIG. 5 is described with reference to FIG. 6 through FIG. 9.

(Step A)

Figure 6:
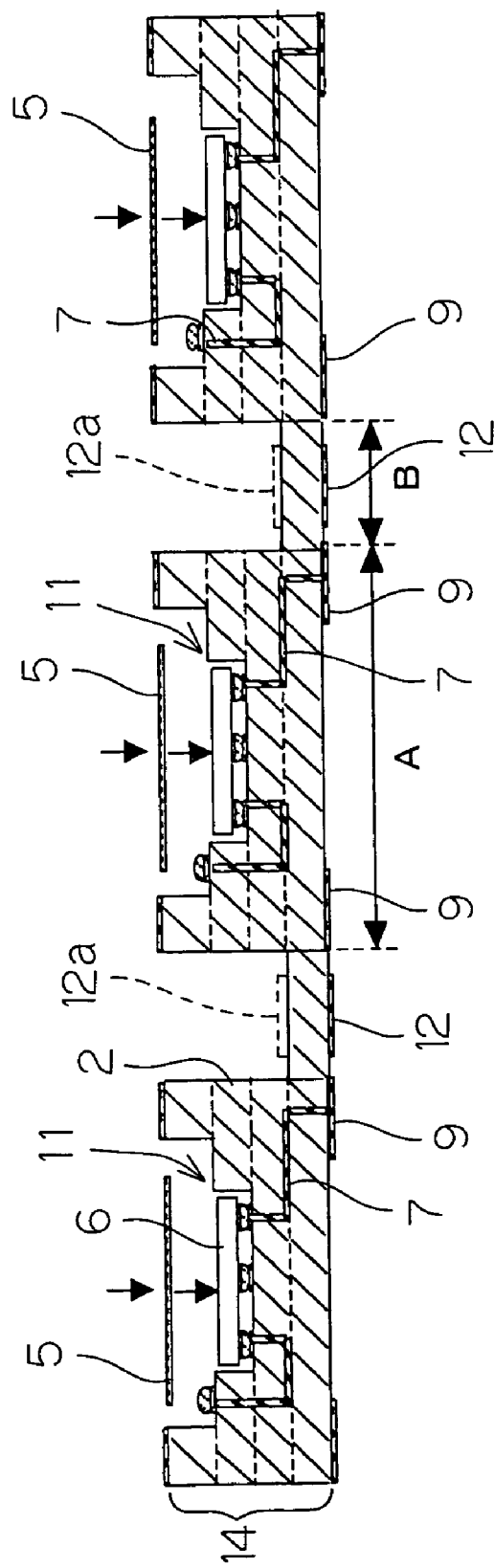
FIG. 6 through FIG. 9 are sectional views each illustrating the method for manufacturing the piezoelectric oscillator according to the invention.

First, a master substrate 14 is prepared wherein the substrate region A having a plurality of external terminals 9, and the throw-away region B having a plurality of write control terminals 12 are alternately arranged in adjoining relation thereby forming a matrix (see FIG. 6).

The master substrate 14 may be produced as follows, for example. A ceramic green sheet is formed from a mixture including ceramic powder such as of alumina ceramics, an organic solvent, an organic binder and the like. The ceramic green sheets are stacked in multiple layers and press-formed into a laminate of ceramic green sheets. The laminate of ceramic green sheets is sintered at high temperatures so as to form the master substrate.

The aforesaid recess 11 is formed by previously forming substantially rectangular windows at predetermined positions of a ceramic green sheet defining an upper part of the aforesaid laminate. More specifically, the window is formed centrally of each substrate region A.

On a lower side of the master substrate 14, a plurality of external terminals 9 are provided in each substrate region A and a plurality of write control terminals 12 are provided in each throw-away region B.

The wiring conductors 7 laid internally of the master substrate 14 are formed by the steps of: printing/applying a conductive paste on/to one surface of a ceramic green sheet constituting the laminate by the conventionally known screen printing method or the like; and sintering the conductive paste concurrently with the aforementioned sintering of the laminate.

Although not illustrated in the figures, the write control terminals 12 are electrically connected with the electrode pads 8b on the bottom of the recess via the wiring conductors through the master substrate 14.

(Step B)

Figure 7:
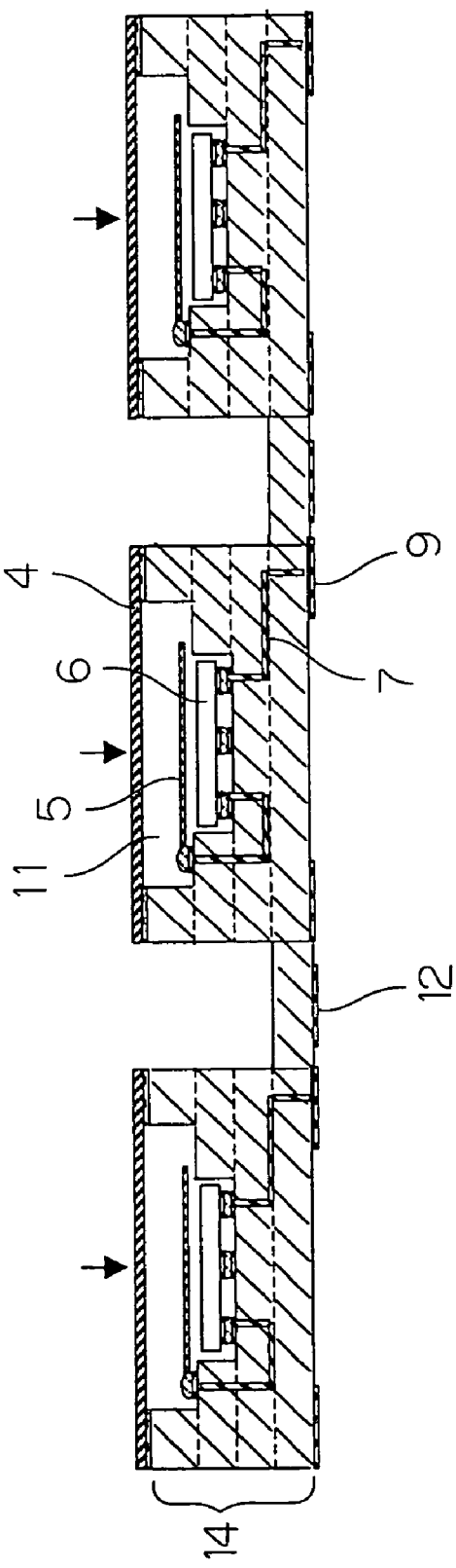

Next, as shown in FIG. 6, the IC 6 and the quartz-crystal oscillator device 5 are accommodated in the recess 11 of each of the substrate regions A on the aforementioned master substrate 14. Thereafter, the aperture of the recess 11 is closed with the closure 4, as shown in FIG. 7.

The recess 11 is formed in a two-step configuration, on the lower step of which the IC 6 is disposed and on the upper step of which the quartz-crystal oscillator device 5 is disposed.

In a case where the IC 6 is of the flip-chip type, the IC 6 is mounted on the bottom of the recess 11 by the conventionally known Face Down Bonding process. Specifically, the IC 6 is placed with the plural connection pads 6a on the lower side thereof abutted against the individually corresponding electrode pads 8b on the bottom of the recess via a conductive bonding material such as a solder. The conductive bonding material is bonded to both the connection pad 6a and the electrode pad 8b. On the other hand, the quartz-crystal oscillator device 5 is mounted by electrically and mechanically connecting the oscillation electrodes at one end thereof with the mounting pads 8a disposed on an intermediate step of the recess 11 via the conductive bonding material.

A welding metal pattern is previously laid on an upper side of the master substrate 14 in a manner to surround the respective apertures of the recesses 11.

In a case where the seal ring 3 (see FIG. 3) is seated on an upper layer of the master substrate 14, an Ni-plate layer or an Au-plate layer for brazing or seam welding is previously deposited on a surface of the seal ring.

The closure 4 is manufactured by working a metal, such as 42 alloy, into a predetermined shape by the conventionally known metal working process. The Ni-plate layer or the Au-plate layer for brazing or seam welding is previously deposited on a lower side of the closure 4.

The outside circumference of the closure 4 is bonded to the aforesaid metal pattern or the aforesaid seal ring on the master substrate 14 using the conventionally known seam welding (resistance welding) or brazing process.

In Step B, electronic circuits in the IC 6 are electrically connected with the quartz-crystal oscillator device 5, the external terminals 9 and the like via the wiring conductors 7 through the master substrate 14.

In the meantime, the IC 6 is also connected with the write control terminals 12 in the throw-away region B via, for instance, the wiring conductors 7 through the master substrate 14.

The master substrate 14 is designed to function as an IC-mounting carrier when the IC 6 is mounted, to function as a crystal-oscillator-device carrier when the quartz-crystal oscillator device 5 is mounted, and to function as a closure-mounting carrier when the closure 4 is assembled to the substrate region A of the master substrate 14. Thus are obviated the facilities for manufacturing the carriers and the like for fixedly retaining the individual substrates, the facilities required by the conventional example. Furthermore, the cumbersome step of loading the individual pieces of substrate on the carriers is also obviated, the substrate pieces obtained by dividing the master substrate 14. In consequence, the piezoelectric oscillator is improved in the productivity.

(Step C)

Figure 8:
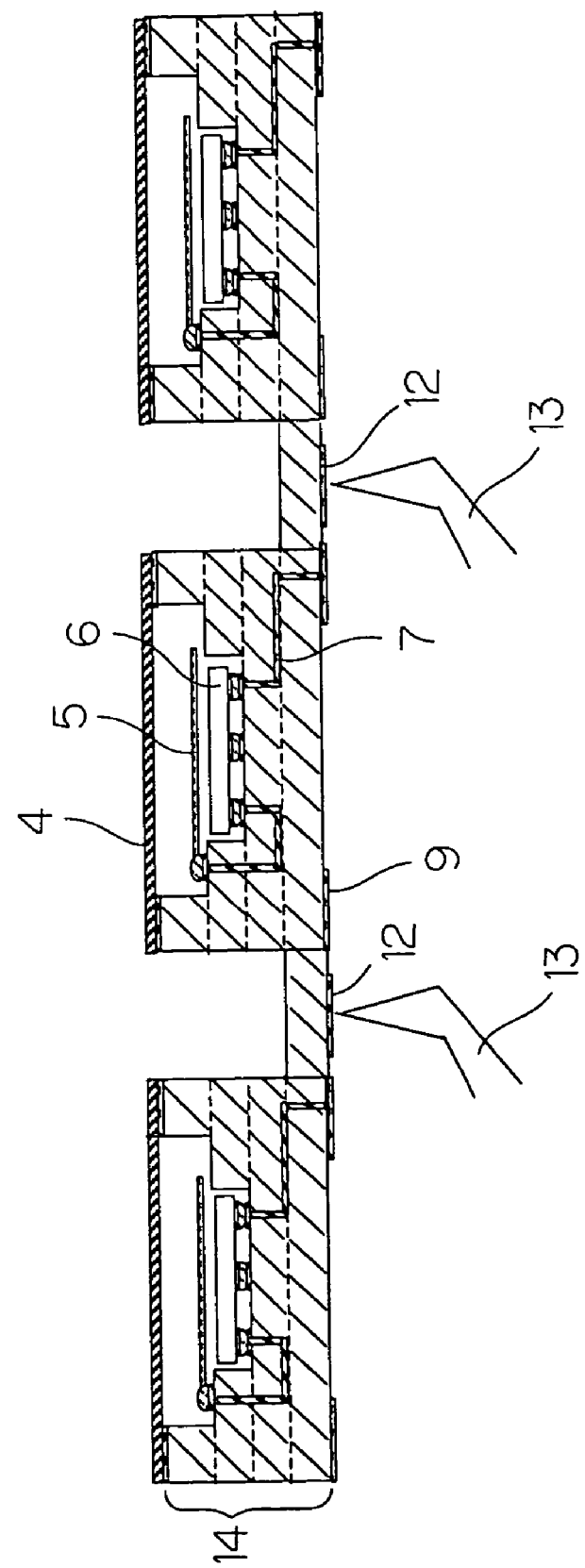

Next, as shown in FIG. 8, the temperature compensation data are inputted to the IC 6 in each substrate region A by way of the plural write control terminals provided at the throw-away region B of the master substrate 14. Thus, the temperature compensation data are stored in the memory in the IC 6.

Figure 9:
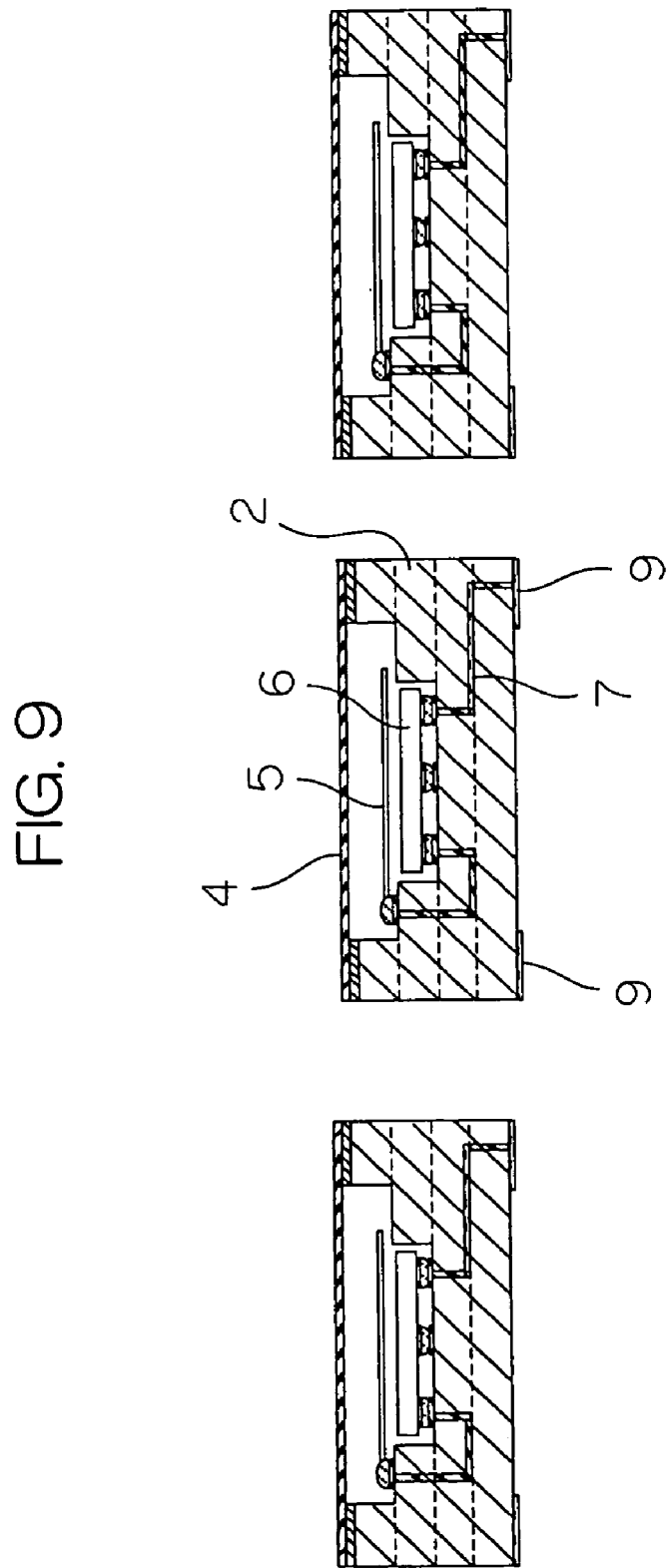

Lastly, the master substrate 14 is cut on the outside circumferences of the individual substrate regions A whereby each substrate region A is cut off from each throw-away region B. The individual substrate regions A thus separated are shown in FIG. 9.

The aforementioned writing operation of the temperature compensation data is accomplished as follows. As shown in FIG. 8, while a probe 13 of a device for writing the temperature compensation data is contacted against the write control terminal 12, the temperature compensation data generated based on the temperature characteristics of the quartz-crystal oscillator device 5 are inputted to and stored in the memory provided in the temperature compensating circuit of the IC 6. It is noted that the temperature compensation data written to the IC 6 are used for compensating for the temperature characteristics varying from quartz-crystal oscillator device to quartz-crystal oscillator device. The data are obtained from measurements of the temperature characteristics previously taken on a quartz-crystal oscillator device 5 used in a piezoelectric oscillator of interest.

In this case, none of the facilities for the socket and the like is necessary, the socket used for inputting the temperature compensation data to the IC 6 of each piezoelectric oscillator. This also contributes to the improved productivity of the piezoelectric oscillator.

The master substrate 14 is divided/cut off by the conventionally known dicing process, whereby the master substrate 14 is divided into a plural number of substrates 1 corresponding to the respective substrate regions.

According to the manufacturing method of the invention as described above, the write control terminals 12 are provided in the throw-away region B of the master substrate 14, and the throw-away region B is cut off from the substrate region A after completion of the writing of the temperature compensation data. This eliminates the necessity of providing a large space at the lateral side or the like of the substrate 1 for disposing the write control terminals 12 and hence, the whole structure of the piezoelectric oscillator can be reduced in size.

Furthermore, the piezoelectric oscillator manufactured by the aforementioned Step A through Step C is free from the write control terminals. When mounted to the external circuit board, therefore, the piezoelectric oscillator does not involve a problem that some of the conductive bonding material used for bonding the oscillator to the circuit board may be adhered to the write control terminal, causing the piezoelectric oscillator to short with the terminal. This leads to an easy handling of the product.

Next, description will be made on a piezoelectric oscillator having another structure manufactured by the method of the invention.

Figure 10:
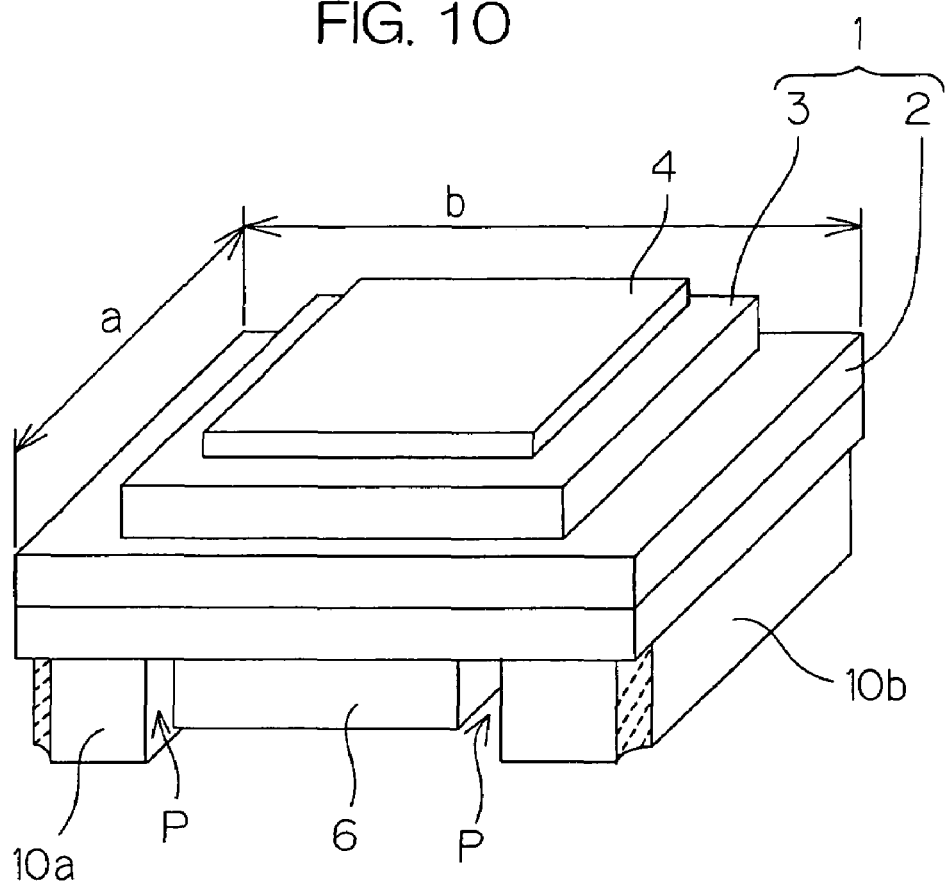
FIG. 10 is a perspective view showing a piezoelectric oscillator manufactured by still another manufacturing method of the invention.
Figure 11:
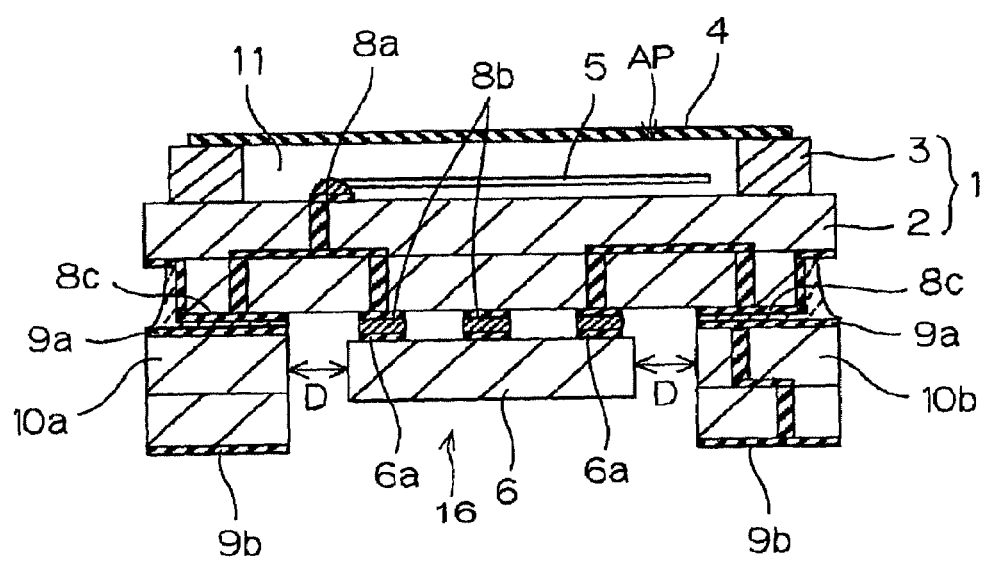
FIG. 11 is a sectional view of the piezoelectric oscillator of FIG. 10.
Figure 12:
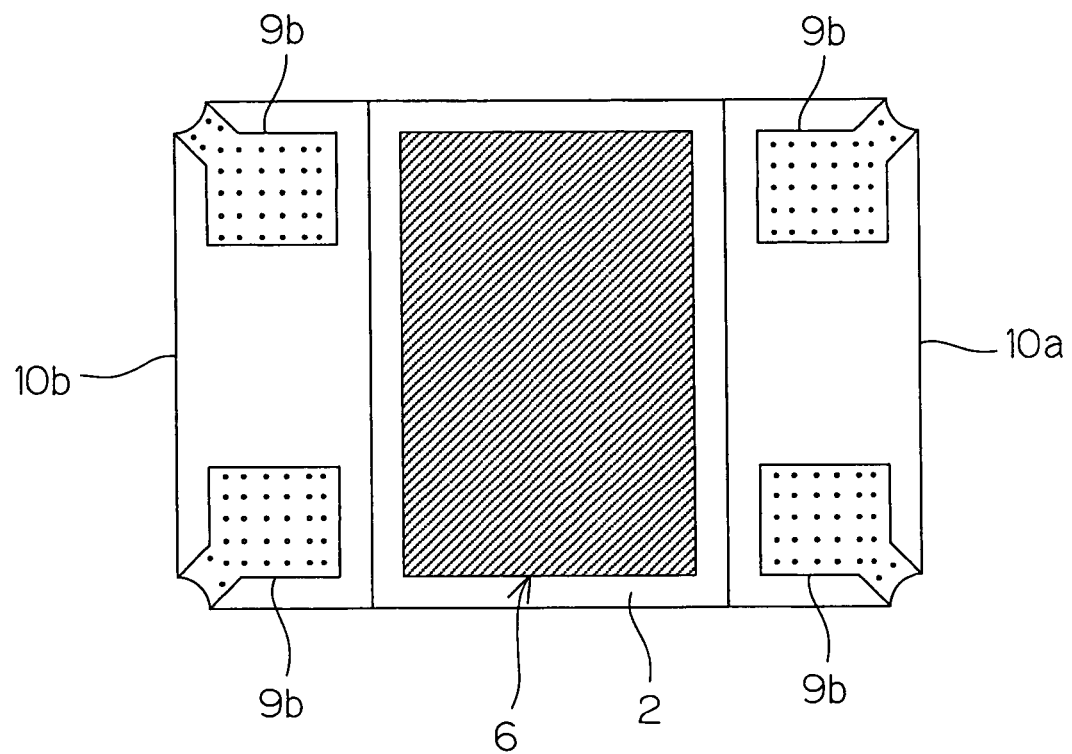
FIG. 12 is a plan view of the piezoelectric oscillator of FIG. 10 as seen from below.

FIG. 10 is a perspective view showing a piezoelectric oscillator manufactured by a manufacturing method of the invention. FIG. 11 is a sectional view of the piezoelectric oscillator, whereas FIG. 12 is a bottom view of the piezoelectric oscillator of as seen from below.

The piezoelectric oscillator shown in these figures includes a package 1 accommodating therein the quartz-crystal oscillator device 5 as the piezoelectric vibrator, and has a structure wherein a mounting substrate (a pair of legs 10a, 10b) is attached to a lower side of the package 1 and the IC 6 is mounted to the package at place inside of the pair of legs 10a, 10b.

The package 1 includes a substrate 2 formed from a ceramic material such as glass-ceramics or alumina-ceramics, and the seal ring 3 formed from a metal such as 42 alloy, Kovar, or phosphor bronze. The recess 11 is defined by an upper side of the substrate 2 and an inner side of the seal ring 3.

The closure 4 for covering the recess 11 is assembled to the upper side of the substrate 2. Thus, a space enclosed by the recess 11 and a lower side of the closure 4 is hermetically sealed.

The substrate 2 is provided with, on its upper side, a pair of mounting pads 8a connected with the oscillation electrodes of the quartz-crystal oscillator device 5, and the like. The substrate 2 is provided with, on its lower side, a plurality of connection electrodes 8c connected with connection electrodes 9a of the legs 10a, 10b; a plurality of electrode pads 8b connected with the connection pads 6a of the IC 6; and the like. These pads and electrodes are electrically interconnected via the wiring pattern laid on a surface of the substrate or via the wiring conductors such as the via hole conductor embedded in the substrate.

On the other hand, the quartz-crystal oscillator device 5 accommodated in the recess 11 of the package 1 is formed by depositing a pair of oscillation electrodes on either main planes of a quartz slice obtained by cutting quartz from a predetermined crystal axis. When an external voltage is applied to the quartz slice via the pair of oscillation electrodes, the quartz slice encounters thickness shear oscillations at given frequencies.

If the closure 4 is connected with an external terminal 9b as the ground terminal (to be described hereinlater) via the package 1 or via wiring conductors through the pair of legs 10a, 10b, the closure 4 is grounded so that the closure may have a shielding function during the operation of the piezoelectric oscillator. Accordingly, the quartz-crystal oscillator device 5 and the IC 6 to be described hereinlater may preferably be protected from unwanted external electrical noises. It is therefore preferred that the closure 4 is connected with the external terminal 9b as the ground terminal via the package 1 or via the wiring conductors through the legs 10a, 10b.

While the pair of legs 10a, 10b and the IC 6 are mounted to the lower side of the package 1, as described above, the IC 6 is mounted in a manner to be embedded between the pair of legs 10a, 10b.

The legs 10a, 10b are formed in rectangular shape using any of the following materials including: (1) glass-cloth based epoxy resins; (2) resin materials such as polycarbonate, epoxy resins and polyimide resins; (3) low-temperature cofired ceramics (LTCC) such as glass-ceramics; and (4) ceramic materials such as alumina-ceramics. The legs are disposed in parallel relation as sandwiching the IC 6 therebetween.

The legs 10a, 10b are each provided with a plurality of connection electrodes 9a on an upper side thereof, the connection electrodes 9a electrically and mechanically connected with the connection electrodes 8c on the lower side of the package. The legs 10a, 10b are each provided with four external terminals 9b (a source voltage terminal, a ground terminal, an oscillation output terminal, and an oscillation control terminal) on a lower side thereof. These connection electrodes 9a and the external terminals 9b are electrically connected with each other via conductive films or the like, which are formed on inside surfaces of grooves formed at end faces or the like of the individual legs 10a, 10b.

The aforesaid four external terminals 9b are designed to be electrically connected with circuit wirings of external electrical circuits when the piezoelectric oscillator is mounted on an external circuit board. Out of the four external terminals 9b, the ground terminal and the oscillation output terminal may be disposed on one 6a of the legs, whereas the source voltage terminal and the oscillation control terminal may be disposed on the other leg 6b. This arrangement locates the oscillation output terminal close to the ground terminal, so that an oscillation signal outputted from the oscillation output terminal may effectively be prevented from suffering noise interferences. It is therefore preferred to dispose the ground terminal and the oscillation output terminal on the same leg 10a or 10b in a manner to adjoin each other.

On the other hand, the IC 6 disposed between the pair of legs 10a, 10b may employ a rectangular flip-chip type IC, which includes a plurality of connection pads 6a connected with the electrode pads 8b of the package 1, the connection pads 6a disposed on the upper side of the IC. The IC is provided with, on its circuit formation surface, the temperature sensor (thermistor) for sensing the ambient temperatures; the memory for storing the temperature compensation data used for compensating for the temperature characteristics of the quartz-crystal oscillator device 5; the temperature compensating circuit operating based on the temperature compensation data thereby compensating for the oscillation characteristics of the quartz-crystal oscillator device 5 according to the temperature variations; the oscillation circuit connected with the temperature compensating circuit and operative to generate a predetermined oscillation output; and the like. The oscillation output generated by the oscillation circuit of such an IC 6 is outputted externally and then is used as a reference signal such as a clock signal.

Out of the four lateral sides of the IC 6, two lateral sides in parallel relation oppose a respective lateral side of the legs 10a, 10b as closely spaced therefrom. The other two lateral sides of the IC orthogonal to the former two lateral sides are exposed to space between end faces of the pair of legs 10a, 10b. The two exposed lateral sides of the IC are located slightly inwardly, say 1 μm to 500 μm inwardly of an outside circumference of the package 1.

A width D of a gap defined between the lateral side of the IC 6 and the lateral side of the leg 10a, 10b is defined to range from 10 μm to 500 μm, for example (see FIG. 11).

A widthwise dimension 'a' of the package 1 or of the pair of legs 10a, 10b with respect to a direction orthogonal to the exposed lateral side of the IC 6 is designed to be substantially equal to the length of one side of the IC 6. A widthwise dimension 'b' of the package 1 with respect to a direction parallel to the exposed lateral side of the IC 6 is designed to be substantially equal to the sum of the length of one side of the IC 6 and the widths of the legs 10a, 10b. Therefore, the whole structure of the piezoelectric oscillator may be reduced in size with respect to either the longitudinal direction and the widthwise direction thereof.

Furthermore, the two exposed lateral sides of the IC 6 are exposed without interference from the pair of legs 10a, 10b, thus allowing for direct observation of a junction between the IC 6 and the package 1. In product inspection, therefore, the bonded conditions of the IC 6 may readily be checked by visual inspection or the like. This also contributes to the improved productivity of the piezoelectric oscillator.

In the aforementioned piezoelectric oscillator, the two parallel lateral sides of the IC 6 are not in tight contact with the pair of legs 10a, 10b but define the gap between themselves and the legs, so that a mounting region for the IC 6 is opened to outside at opposite ends P thereof. Accordingly, even in a case where the surfaces of the IC 6 and the lower side of the package 1 are exposed to a cleaning fluid in a cleaning step such as performed after the completed piezoelectric oscillator is mounted on the external circuit board, the cleaning fluid is allowed to flow into or out of the areas P between the IC 6 and the pair of legs 10a, 10b quite smoothly and favorably. This also affords an advantage that the aforementioned cleaning step is efficiently performed while the cleaning fluid is effectively prevented from remaining on the mounting region for the IC 6.

Next, a manufacturing method for the aforementioned piezoelectric oscillator will be described with reference to FIG. 13 through FIG. 21.

Figure 13:
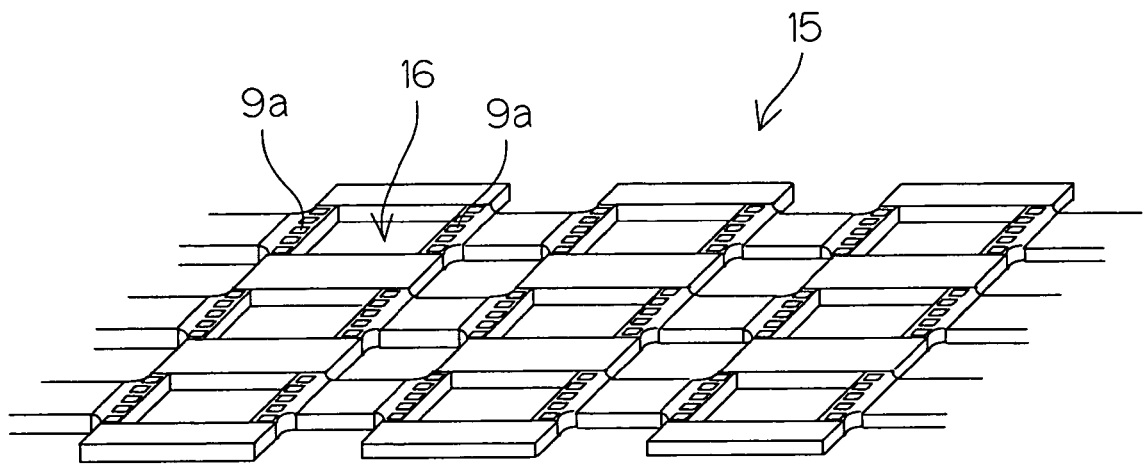
FIG. 13 is a perspective view of a master substrate used by the manufacturing method of the invention as seen from one main surface thereof.
Figure 14:
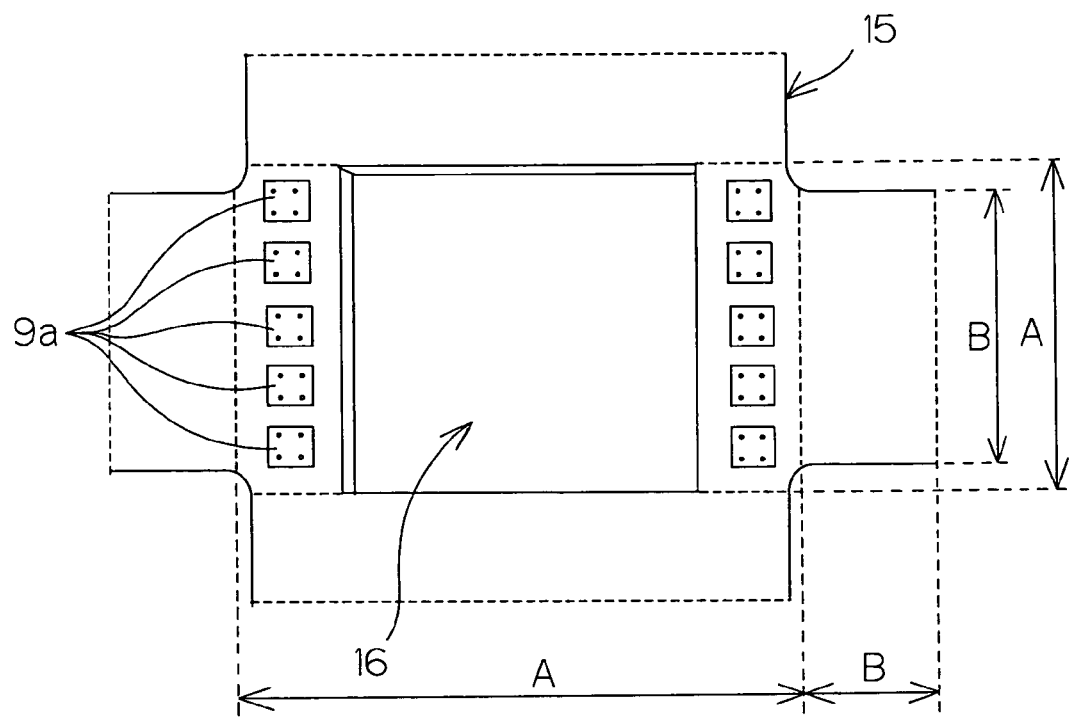
FIG. 14 is an enlarged plan view of the master substrate.

FIG. 13 is a perspective view of a master substrate used in the manufacturing method of the invention as seen from one main surface thereof. FIG. 14 is an enlarged plan view of the master substrate.

Figure 15:
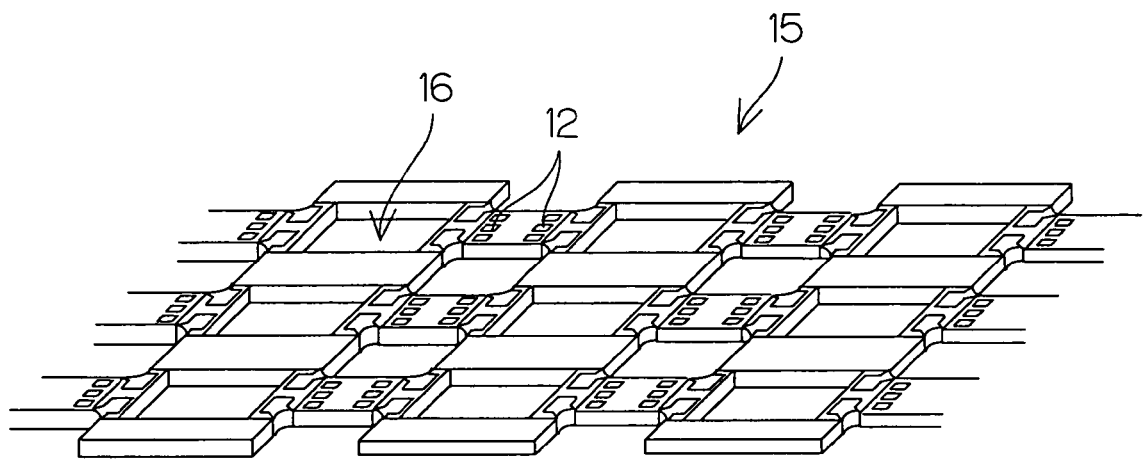
FIG. 15 is a perspective view of the master substrate as seen from the other main surface thereof.
Figure 16:
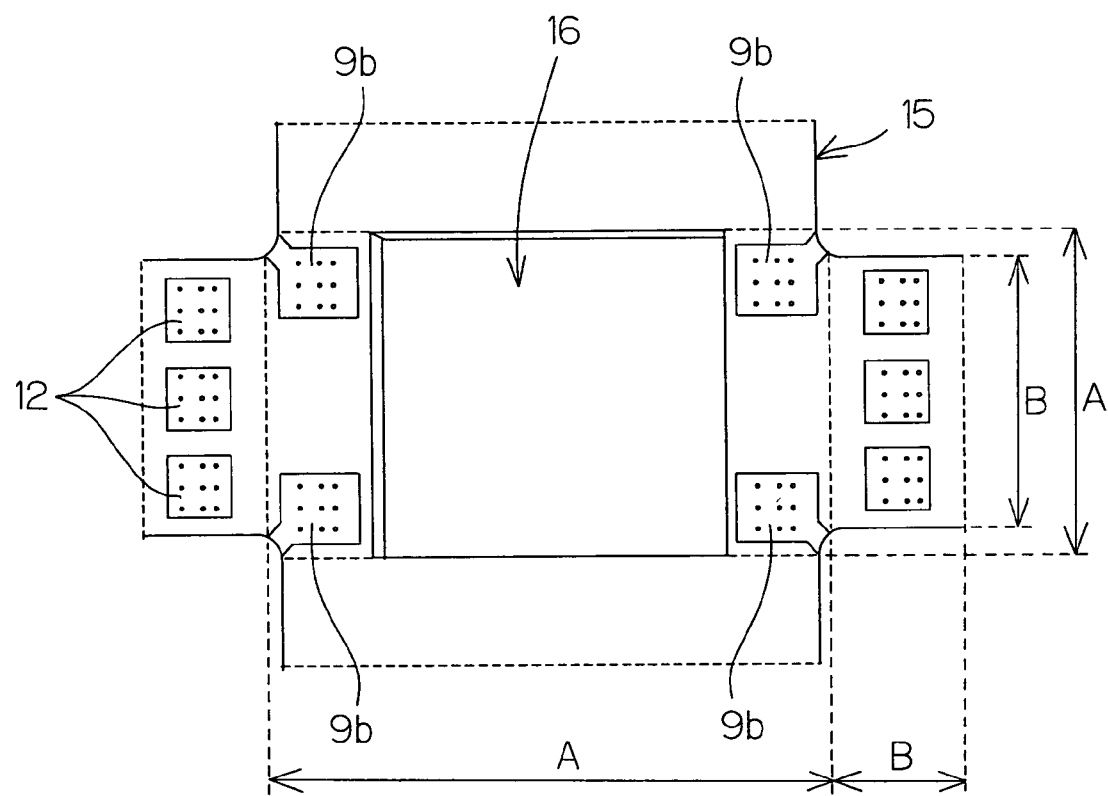
FIG. 16 is an enlarged plan view of the master substrate.

FIG. 15 is a perspective view of the master substrate as seen from the other main surface thereof. FIG. 16 is an enlarged plan view of the master substrate.

FIG. 17 through FIG. 21 are sectional views each illustrating the method for manufacturing the piezoelectric oscillator according to the invention.

It is noted that wiring conductors provided at the package 1, the pair of legs 10a, 10b and the like are not depicted in FIG. 17 through FIG. 21.

(Step A)

First, as shown in FIG. 13 through FIG. 16, a master substrate 15 is prepared wherein the substrate region A having a window 16, and the throw-away region B having a plurality of write control terminals 12 are alternately arranged in adjoining relation thereby forming a matrix.

Such a master substrate 15 is formed from the same material as that of the aforesaid pair of legs 10a, 10b. The material may be any of the glass-cloth based epoxy resins, the resin materials such as polycarbonate resins, epoxy resins and polyimide resins, the low-temperature cofired ceramics such as glass-ceramics, the ceramic materials such as alumina-ceramics, and the like. In a case where the master substrate is formed using a glass-cloth based epoxy resin, for example, a base of the substrate is formed by impregnating a glass-cloth base with a liquid epoxy precursor and polymerizing the precursor at high temperatures, the glass-cloth base formed by weaving glass fiber.

The window 9 formed in the substrate region A of the master substrate 15 has a rectangular shape as longitudinally extended across the substrate region A. A predetermined rectangular-shaped area in each substrate region A of the master substrate 15 is cut away by punching or the like so as to define the window 16.

One main surface of the master substrate 15 is provided with a plurality of connection electrodes 9a in each substrate region A, whereas the other main surface thereof is provided with a plurality of external terminals 9b in each substrate region A. The other main surface of the master substrate 15 is further provided with a plurality of write control terminals 12 in each throw-away region B.

These write control terminals 12, the connection electrodes 9a and the external terminals 9b are formed as follows. A metal foil such as a copper foil is attached to a surface of the master substrate 15 and patterned into a predetermined wiring pattern using a conventionally known photo-etching method or the like.

In this embodiment, as shown in FIG. 14, the plural connection electrodes 9a disposed in each substrate region A are arranged in two lines on the one main surface of the master substrate 15, the two lines of connection electrodes sandwiching the window 16 therebetween.

As shown in FIG. 16, on the other hand, four external terminals 9b are arranged in two lines on the other main surface of the master substrate 15, the two lines of external terminals sandwiching the window 16 therebetween just as the connection electrodes 9a. The plural write control terminals 12 disposed in the throw-away region B are arranged in a line parallel to each of the lines of the external terminals 9b.

(Step B)

Figure 17:
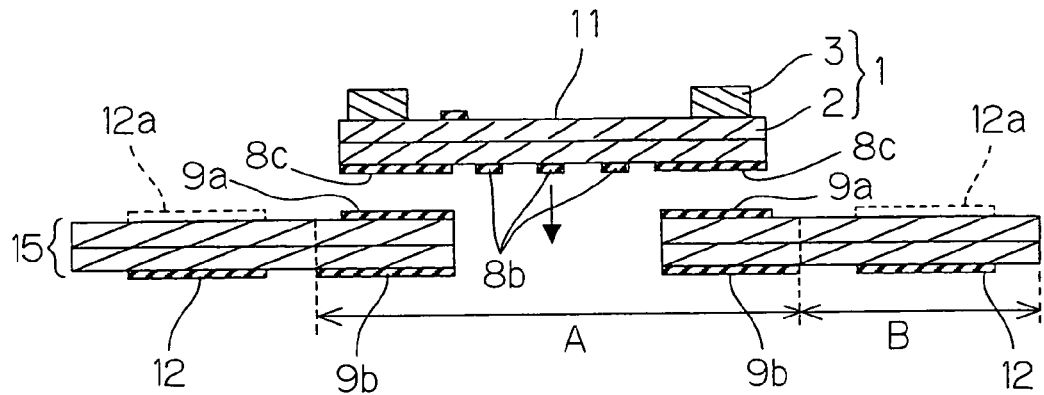
FIG. 17 through FIG. 21 are sectional views each illustrating the method for manufacturing the piezoelectric oscillator according to the invention.

Next, as shown in FIG. 17, the package 1 including the recess 11 is mounted on each of the substrate regions A of the master substrate 15 in a manner to close the window 16.

The package 1 includes the substrate 2 and the seal ring 3, as described above.

The substrate 2 may be manufactured as follows, for example. A ceramic green sheet is formed from a mixture including ceramic powder such as of alumina ceramics, a suitable organic solvent and the like. A conductive paste to define a wiring conductor is printed on/applied to a surface of the green sheet in a predetermined pattern. The resultant ceramic green sheets are stacked in multiple layers and press-formed into a laminate of ceramic green sheets. The laminate of ceramic green sheets is sintered at high temperatures so as to form the substrate. Then, the package 1 including the recess 11 is assembled by seating/fixing the seal ring 3 on/to an upper side of the substrate 2.

The seal ring 3 is manufactured using the conventionally known metal working method wherein a metal such as 42 alloy is worked into a predetermined shape. The seal ring 3 is brazed to a conductive layer previously deposited on the upper side of the substrate 2 so as to be fixed to the substrate 2.

As shown in FIG. 17, such a package 1 is provided with a plurality of connection electrodes 8c and a plurality of electrode pads 8b on the lower side thereof.

The package 1 may be mounted in the following manner. The package 1 is seated on the one main surface of the master substrate 15 in each of the substrate regions A in a manner that the plural connection electrodes 8c thereof are contacted against the corresponding connection electrodes 9a of the master substrate 15 via a conductive bonding material such as a solder, while the plural electrode pads 8b are located inwardly of the window 16. Subsequently, the conductive bonding material is molten by heating or such, thereby to bond the connection electrodes 8c to the connection electrodes 9a via the conductive bonding material. Thus, the package 1 is fixed to/mounted on the master substrate 15. The package 1 mounted on the master substrate 15 is shown in FIG. 18.

(Step C)

Figure 18:
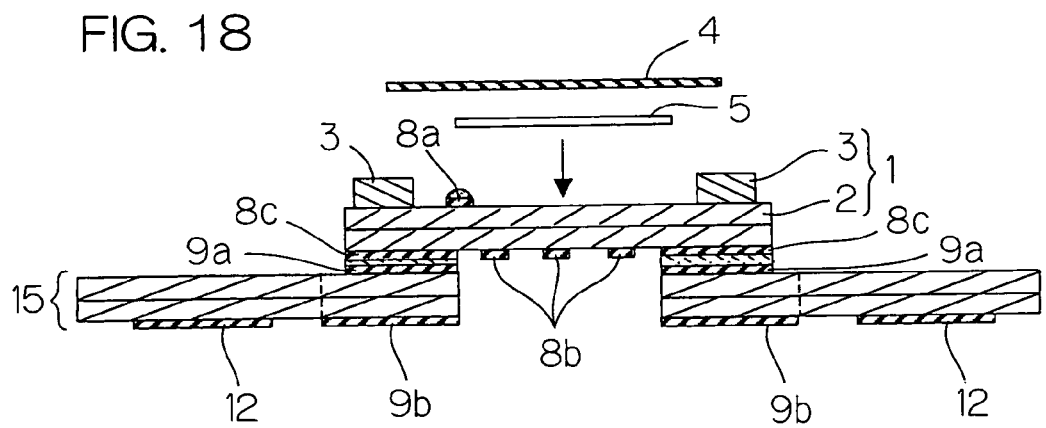

Next, the quartz-crystal oscillator device 5 is mounted in the recess 11 of each package 1 mounted on the master substrate 15, as shown in FIG. 18. In this process, the oscillation electrodes of the quartz-crystal oscillator device 5 are electrically and mechanically connected with the mounting pads 8a in the recess 11 via the conductive bonding material. The recess 11 accommodating therein the quartz-crystal oscillator device 5 is sealed by bonding the closure 4 to the seal ring 3 by resistance welding or such.

In this step, the package 1 is unified with the master substrate 15 as attached thereto and hence, the quartz-crystal oscillator device 5 can be precisely accommodated in the recess 11 of the package 1. In the meantime, the sealing with the closure 4 can also be accomplished with high precisions for the same reason.

The closure 4 is formed from the same material as that of the seal ring 3 by the same working method as that for the seal ring 3. Where the seal ring 3 and the closure 4 are bonded together by the resistance welding, as described above, the seal ring 3 and the closure 4 are previously coated with an Ni plate layer, Au plate layer or the like.

(Step D)

Figure 19:
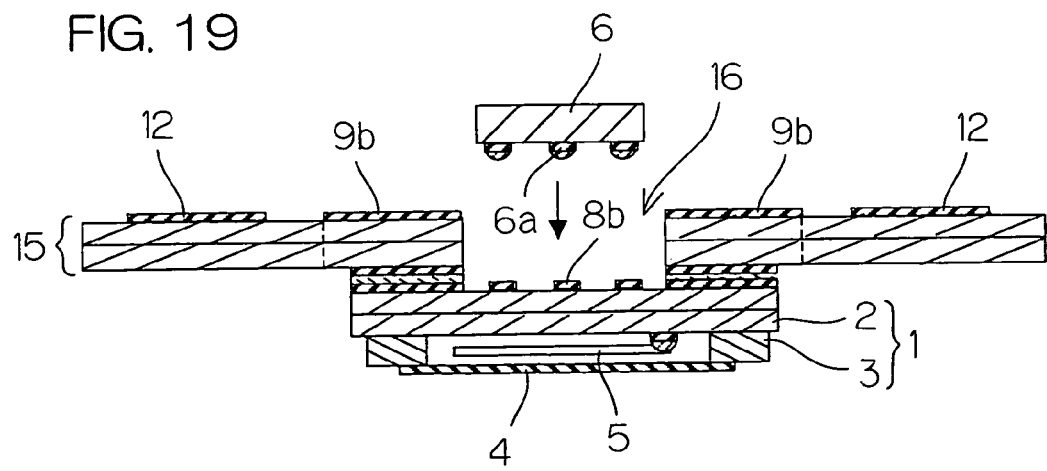

Next, the master substrate 15 is turned upside down, as shown in FIG. 19, and the IC 6 for controlling the oscillation output of the quartz-crystal oscillator device 5 is mounted to a lower side of the package 1 (depicted as an upper side in FIG. 19) at place inside of the window 16.

As mentioned supra, the IC 6 employs a rectangular flip-chip type IC including a plurality of connection pads 6a on its side opposite the package 1.

The IC 6 is seated on the package 1 in a manner that the plural connection pads 6a on one surface of the IC are contacted against the corresponding electrode pads 8b of the package 1 via a conductive bonding material such as a solder, the electrode pads 8b exposed in the window 16 of the master substrate 15. Subsequently, the conductive bonding material is molten by heating or such, thereby bond the connection pads 6a to the electrode pads 8b via the conductive bonding material. Thus, the IC 6 is mounted on the package 1.

In Step D, the package 1 is mounted on each of the substrate regions A of the master substrate 15, while allowing the IC 6 to be mounted thereto, whereby the electronic circuits in the IC 6 are electrically connected with the quartz-crystal oscillator device 5, the external terminals 9b and the like via the wiring conductors through the package 1, the wiring conductors through the master substrate and the like. In the mean time, the write control terminals 12 in the throw-away region B are also electrically connected with the IC 6 via the wiring conductors through the package 1 and the master substrate 15.

The master substrate 15 and the package 1 are bonded to each other via the conductive bonding material so that a predetermined gap P exists between non-bonded portions of the master substrate and the package. Therefore, when the IC 6 is mounted to the lower side of the package 1 via the conductive bonding material such as a solder, heat required for the bonding may preferably be transferred to the conductive bonding material between the package 1 and the IC 6 through the aforesaid gap P and the like. This permits the IC 6 to be mounted efficiently and assuredly and hence, the reliability and productivity of the piezoelectric oscillator are increased.

Figure 20:
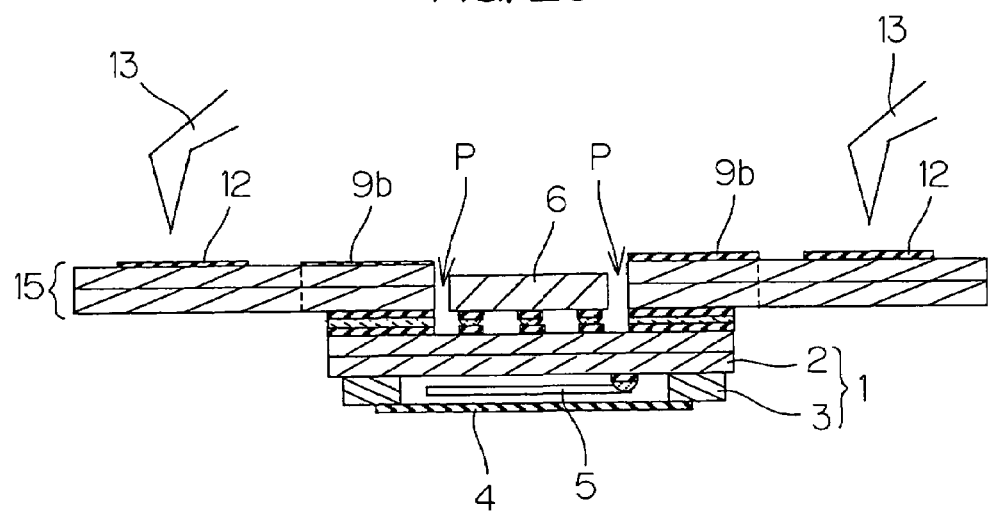

In Step D, the temperature compensation data are inputted to the IC 6 in each substrate region A via the plural write control terminals 12 disposed in the throw-away region B of the master substrate 15, as shown in FIG. 20. Thus, the temperature compensation data are stored in the memory in the IC 6.

Such a writing operation of the temperature compensation data is accomplished by inputting the temperature compensation data to the memory disposed in the temperature compensating circuit of the IC 6 with the probe 13 of the temperature-compensation-data writing device contacted against the write control terminals 12 and by storing the input data in the memory, the temperature compensation data generated based on the temperature characteristics of the quartz-crystal device 5. It is noted that the temperature compensation data written to the IC 6 are used for compensating for the temperature characteristics varying from quartz-crystal oscillator device to quartz-crystal oscillator device. The data are obtained from measurements of the temperature characteristics previously taken on a quartz-crystal oscillator device 5 used in a piezoelectric oscillator of interest.

In this case, none of the facilities for the socket and the like is necessary, the socket used for writing the temperature compensation data to the IC 6 of each piezoelectric oscillator. This also contributes to the improved productivity of the piezoelectric oscillator.

(Step E)

Figure 21:
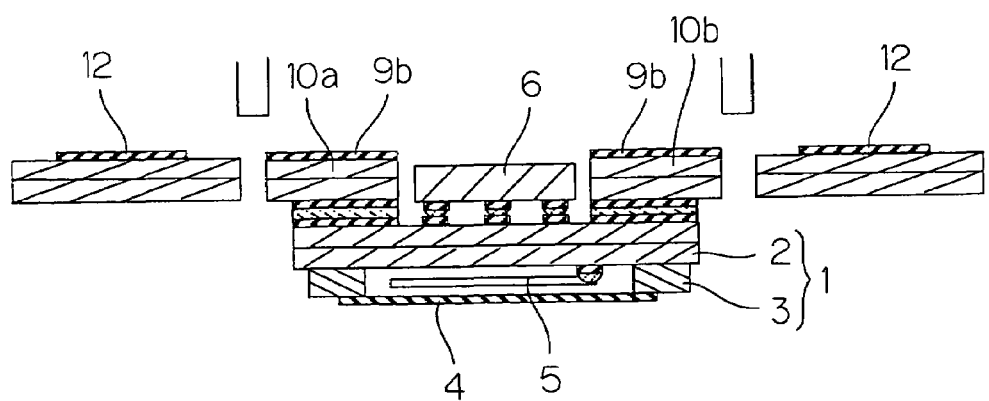

Finally, as shown in FIG. 21, the individual substrate regions A are cut off from the respective throw-away regions B by cutting the master substrate 15 on the outside circumferences of the individual substrate regions A.

The master substrate 15 is cut by the conventionally known dicing process or the like. The master substrate 15 subjected to the cutting process is divided into the individual substrate regions. This provides a plurality of piezoelectric oscillators at a time, the oscillator including the package 1, to the lower side of which the mounting substrate (the pair of legs 10a, 10b) corresponding to the substrate region A and the IC 6 are mounted.

In this case, the master substrate 15 is divided after the ICs 6 are mounted thereto. During the mounting of the ICs 6, the master substrate 15 itself functions as the IC mounting carrier, so that such an IC carrier as described in the section of the conventional example is not necessary. In addition, the cumbersome operation of loading on the carrier each of the sub-substrates obtained by dividing the master substrate 15 into pieces is also obviated. This also leads to the increased productivity of the piezoelectric oscillator.

According to the aforementioned manufacturing process, the write control terminals 12 are disposed in the throw-away region B, which is cut off from each of the leg pair 10a, 10b after completion of the writing of the temperature compensation data. This eliminates the necessity of providing the large spaces on the leg pair 10a, 10b for disposing the write control terminals 12. Hence, the whole structure of the piezoelectric oscillator may be reduced in size.

The piezoelectric oscillator manufactured by the aforementioned Step A through Step E is free from the write control terminals 12. When the piezoelectric oscillator is mounted on the external circuit board, therefore, the oscillator does not involve the problem that some of the conductive bonding material used for bonding the oscillator to the circuit board may be adhered to the write control terminals, causing the oscillator to short with the terminal. This leads to the easy handling of the product.

According to the embodiment, the package 1 is formed from the ceramic material featuring good workability and sealing performance, whereas the master substrate 15 is formed from the resin material featuring good workability during the cutting process and easy handling. Accordingly, the piezoelectric oscillator having high reliability can be manufactured quite efficiently and at low costs. It is therefore preferred that the package 1 is formed from the ceramic material whereas the master substrate 15 is formed from the resin material.

FIG. 22 through FIG. 25 are sectional views each illustrating another manufacturing method of the invention or a piezoelectric oscillator having another structure.

Figure 22:
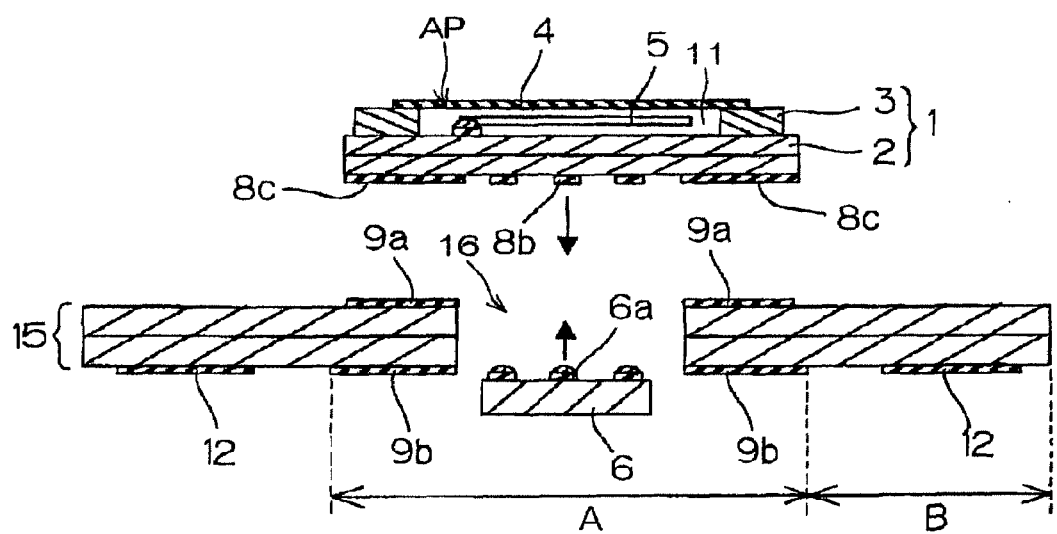

FIG. 22 illustrates a replacement of the method shown in FIG. 17 through FIG. 19. An assembly is manufactured by mounting the quartz-crystal oscillator device 5 in the recess 11 of each package 1, and then assembling the closure 4 to the seal ring 3 for sealing the quartz-crystal oscillator device 5. The resultant assembly is mounted on the region A of the master substrate 15, while the IC 6 is mounted to the bottom of the substrate 2.

In this state, the temperature compensation data are written to the IC 6 in each substrate region A via the plural write control terminals 12 disposed in the throw-away region B of the master substrate 15, as described with reference to FIG. 20. As shown in FIG. 21, the master substrate 15 is cut on the outside circumferences of the individual substrate regions A, thereby cutting off the individual substrate regions A from the throw-away regions B. Thus are manufactured the piezoelectric oscillators.

The piezoelectric oscillator manufactured by this method has absolutely the same structure as the piezoelectric oscillator manufactured by the method shown in FIG. 17 through FIG. 21. What is different is the manufacturing procedure. In the method shown in FIG. 17 through FIG. 21, the package 1 is mounted on the master substrate 15 and thereafter, the quartz-crystal oscillator device 5 is mounted in the recess 1 of the package 1. In the method shown in FIG. 22, on the other hand, the quartz-crystal oscillator device 5 is mounted in the recess 1 of the package 1 and thereafter, the resultant assembly is mounted on the master substrate 15.

Figure 23:
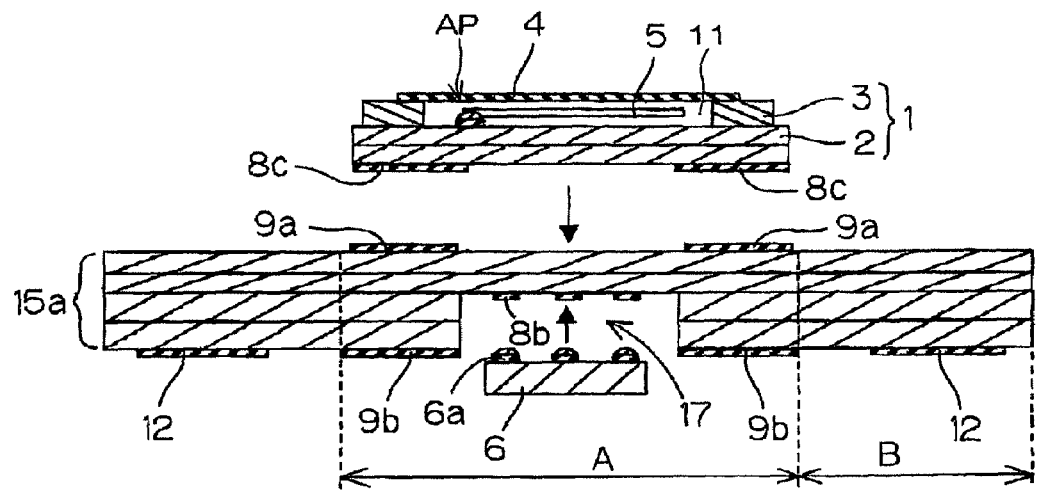

FIG. 23 is a sectional view illustrating a step of a process for manufacturing a piezoelectric oscillator having another structure. In the manufacturing process shown in FIG. 17 through FIG. 22, the region A of the master substrate 15 is formed with the window 16 penetrating through the substrate. However, the manufacturing process of FIG. 23 uses a master substrate 15a increased in the number of substrate layers. The region A of the master substrate 15a is formed with a recess 17 not penetrating through the master substrate 15a, instead of the window 16 penetrating through the master substrate 15a, the recess 17 formed on a side of the region A opposite from a side on which the package 1 is mounted. The plural electrode pads 8b are provided on a bottom of the recess 17. The connection pads 6a of the IC 6 are contacted against the electrode pads 8b on the bottom of the recess 17 so as to mount the IC 6 to the master substrate 15a. Mounted on the opposite side of the master substrate 15a is the package 1 accommodating therein the quartz-crystal oscillator device 5. A plurality of connection electrodes 9a for connection with the package 1 are connected with the electrode pads 8b via intra-layer wirings.

This structure differs from that of the piezoelectric oscillator shown in FIG. 17 through FIG. 22 in that the IC 6 is not directly connected with the package 1 assembled with the quartz-crystal oscillator device 5 but is connected therewith via the intra-layer wirings through the master substrate 15a.

FIG. 24 is a sectional view illustrating a step of a process for manufacturing a piezoelectric oscillator having still another structure. Similarly to the process of FIG. 23, this manufacturing process uses a master substrate 15b increased in the number of substrate layers. What is different from the process of FIG. 23 is that the region A of the master substrate 15b is formed with a recess 18 on a side thereof, on which the package 1 is mounted, and that the IC 6 is mounted in the recess 18, over which the package 1 accommodating therein the quartz-crystal oscillator device 5 is mounted to the master substrate 15b. Accordingly, the IC 6 is disposed in an internal space enclosed by the package 1 accommodating therein the quartz-crystal oscillator device 5 and the master substrate 15b. Hence, the IC 6 is not exposed to outside of the piezoelectric oscillator.

Figure 25:
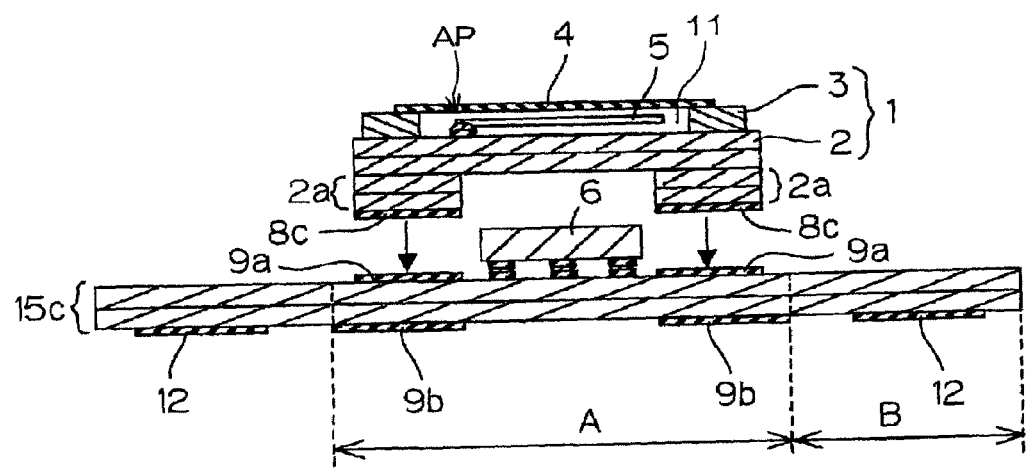
Figure 26:
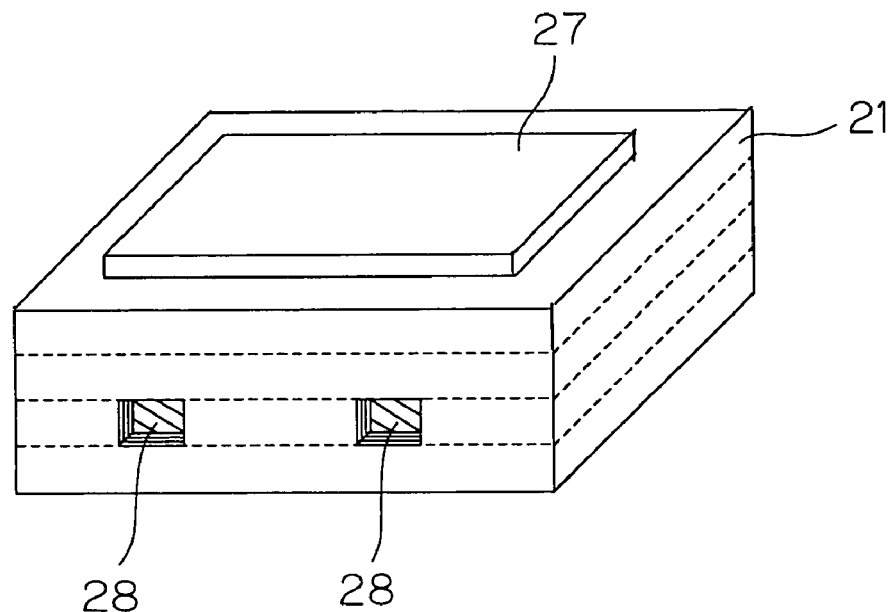
FIG. 26 is a perspective outside view showing a conventional piezoelectric oscillator.
Figure 27:
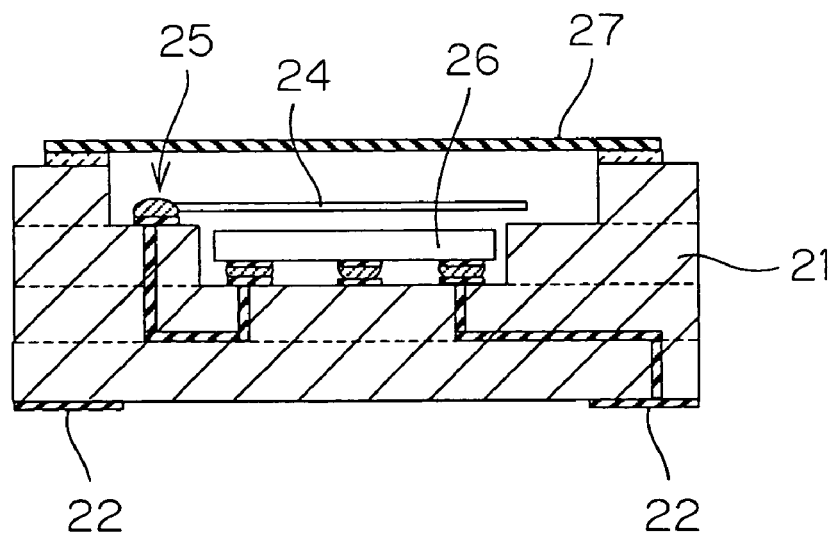
FIG. 27 is a sectional view of the piezoelectric oscillator shown in FIG. 26.

FIG. 25 is a sectional view illustrating a step of a process for manufacturing a piezoelectric oscillator having still another structure. Similarly to the process of FIG. 24, this manufacturing process disposes the IC 6 in an internal space enclosed by the package 1 accommodating therein the quartz-crystal oscillator device 5 and a master substrate 15c. Thus, the embodiment has a common feature to that of FIG. 24 in that the IC 6 is not exposed to outside of the piezoelectric oscillator.

While the structure shown in FIG. 24 is made such that the master substrate 15b is formed with the recess 18, in which the IC 6 is mounted, the structure shown in FIG. 25 is made such that the IC 6 is mounted on a flat surface of the master substrate 15c and is covered by the package 1 accommodating therein the quartz-crystal oscillator device 5. Therefore, the master substrate 15c may be reduced in thickness. In order to provide a space to cover the IC 6, however, the substrate 2 of the package 1 must be increased in the number of layers such as to form legs 2a.

In the foregoing embodiments, the write control terminals 12 of the throw-away region B are provided on the same side that is formed with the external terminals 9. Alternatively, write control terminals 12a may be provided on the opposite side, as indicated by a broken line in FIG. 6 or FIG. 17.

In the foregoing embodiments, the write control terminals in the throw-away region B are arranged in the parallel line to the line of the external terminals 9b, as shown in FIG. 16.

Alternatively, the write control terminals in the throw-away region B may be arranged in a line orthogonal to the line of the external terminals 9b.

The foregoing embodiments employ the pair of legs 10a, 10b as the mounting substrate which are cut out from the master substrate 15. However, there may also be used four legs which are obtained by dividing the respective legs 10a, 10b into two pieces. Alternatively, three legs obtained by dividing either one of the legs 10a, 10b into two pieces are also usable.

A single substrate shaped like a square frame may also be used as the mounting substrate. In this case, a hole is formed through the master substrate 15 to define the window 16, which is not longitudinally extended across the substrate region A, but which has every outside circumference thereof spaced inwardly of the outside circumference of the substrate region A.

In the foregoing embodiments, the bonding between the master substrate 14, 15 and the package 1 or between the package 1 and the IC 6 may be accomplished using an anisotropic conductive bonding material. In this case, the electrical and mechanical connection between the master substrate 15 and the package 1, or the electrical and mechanical connection between the package 1 and the IC 6 may be accomplished by one operation. This leads to an advantage of dramatically simplifying the assembly work of the piezoelectric oscillator.

In the foregoing embodiments, a resin material may be filled/formed in the gap defined between the package 1 and the IC 6 and between the master substrate 15 and the package 1, such that the resin material may cover the conductive bonding material bonding together the opposite pads and the opposite electrodes. In this case, the resin material provides a favorable protection of the circuit formation surface of the IC and besides, reinforces the bonded portion of the IC and the bonded portions of the pair of legs 10a, 10b. This also leads to the increased strength and reliability of the piezoelectric oscillator.

In the foregoing embodiments, the closure 4 of the package 1 is connected to the substrate 2 via the seal ring 3. However, an alternative approach may be taken. That is, a metalized pattern for bonding is previously formed on the upper side of the substrate 2 and then, the closure 4 is directly welded to the metalized pattern. Alternatively, a brazing filler metal such as Au-Sn alloy may be used for brazing the closure 4 to the metalized pattern formed on the upper side of the substrate 2.

In the foregoing embodiments, the seal ring 3 is directly attached to the upper side of the substrate of the package 1. However, an alternative approach may be taken. That is, a frame member formed from the same ceramic material that forms the substrate 2 is integrally attached to the upper side of the substrate 2 and then, the seal ring 3 is attached to an upper side of the frame member.

In the foregoing embodiments, the legs 10a, 10b are formed in a rectangular shape. However, these legs 10a, 10b may be formed with notches on their inside surfaces, outside surfaces, corners or the like, such that a conductor pattern may be deposited on surface areas of the legs 10a, 10b that are continuous to the notches, or such that small electronic devices such as chip capacitors may be disposed at spaces defined by the notches (see, areas represented by hatched broken lines in FIG. 10, FIG. 11).

According to the foregoing embodiments, it goes without saying that a resin material or the like may be filled in the gap defined between the lateral sides of the IC 6 and the legs 10a, 10b for reinforcing and sealing purposes.

It is to be noted that other various changes and modifications may be made to the invention so long as such changes and modifications do not deviate from the scope of the invention.

The invention claimed is:

1. A method for manufacturing a piezoelectric oscillator comprising the steps of:
    (a) preparing a master substrate partitioned into plural substrate regions;
    (b) mounting, on each of the substrate regions, a piezoelectric vibrator and an IC for controlling an oscillation output of the piezoelectric vibrator; and
    (c) dividing the master substrate into the individual substrate regions by cutting the master substrate on outside circumferences of the individual substrate regions, thereby obtaining a plurality of piezoelectric oscillators,
    wherein in the step (a), a recess is formed in each of the substrate regions of the master substrate,
    wherein in the step (b), the piezoelectric vibrator and the IC are accommodated in the recess of the substrate region and thereafter, an aperture of the recess is closed with a closure,
    wherein in the step (a), the recess is formed in a two-step configuration including a deep recess portion on a relatively inner side, and a shallow recess portion on a relatively outer side,
    wherein in the step (b), either one of the piezoelectric vibrator and the IC for controlling the oscillation output of the piezoelectric vibrator is accommodated in the deep recess portion on the relatively inner side, whereas the other device is accommodated in the shallow recess portion on the relatively outer side.

2. A method for manufacturing a piezoelectric oscillator comprising the steps of:
    (a) preparing a master substrate partitioned into plural substrate regions;
    (b) mounting, on each of the substrate regions, a piezoelectric vibrator and an IC for controlling an oscillation output of the piezoelectric vibrator; and
    (c) dividing the master substrate into the individual substrate regions by cutting the master substrate on outside circumferences of the individual substrate regions, thereby obtaining a plurality of piezoelectric oscillators,
    wherein in the step (a), a recess is formed in each of the substrate regions of the master substrate, and a seal ring is seated on/fixed to a periphery of the recess in a manner to enclose a peripheral area of an aperture of the recess,
    wherein in the step (b), either one of the piezoelectric vibrator and the IC for controlling the oscillation output of the piezoelectric vibrator is accommodated in the recess of each of the substrate regions, whereas the other device is mounted with a part thereof located on the peripheral area of the aperture of the recess, and then an opening of the seal ring is closed with a closure.

3. A method for manufacturing a piezoelectric oscillator comprising the steps of:
    (a) preparing a master substrate partitioned into plural substrate regions;
    (b) mounting, on each of the substrate regions, a package for accommodating a piezoelectric vibrator, and an IC for controlling an oscillation output of the piezoelectric vibrator; and
    (c) dividing the master substrate into the individual substrate regions by cutting the master substrate on outside circumferences of the individual substrate regions, thereby obtaining a plurality of piezoelectric oscillators, wherein in the step (a), the prepared master substrate is formed with a window in each of the substrate regions, the window penetrating through the master substrate, and wherein in the step (b), the prepared package includes a recess, and is loaded from one side of the master substrate so as to be mounted on each of the substrate regions in a manner to close the window, wherein the recess of the package accommodates therein the piezoelectric vibrator and has an aperture thereof sealed with a closure, and wherein the IC for controlling the oscillation output of the piezoelectric vibrator is inserted through the window from the other side of the master substrate so as to be mounted to a lower side of the package.

4. A method for manufacturing a piezoelectric oscillator comprising the steps of:

(a) preparing a master substrate partitioned into plural substrate regions;

(b) mounting, on each of the substrate regions, a package for accommodating a piezoelectric vibrator, and an IC for controlling an oscillation output of the piezoelectric vibrator; and (c) dividing the master substrate into the individual substrate regions by cutting the master substrate on outside circumferences of the individual substrate regions, thereby obtaining a plurality of piezoelectric oscillators, wherein in the step (a), the prepared master substrate is formed with a window in each of the substrate regions, the window penetrating through the master substrate, and wherein in the step (b), the prepared package includes a recess and has an arrangement in which the recess thereof accommodates therein the piezoelectric vibrator and has its aperture sealed with a closure, wherein the package is loaded from one side of the master substrate so as to be mounted on each of the substrate regions in a manner to close the window, and wherein the IC for controlling the oscillation output of the piezoelectric vibrator is inserted through the window from the other side of the master substrate so as to be mounted to a lower side of the package.

5. A method for manufacturing a piezoelectric oscillator comprising the steps of:

(a) preparing a master substrate partitioned into plural substrate regions;

(b) mounting, on each of the substrate regions, a package for accommodating a piezoelectric vibrator, and an IC for controlling an oscillation output of the piezoelectric vibrator; and (c) dividing the master substrate into the individual substrate regions by cutting the master substrate on outside circumferences of the individual substrate regions, thereby obtaining a plurality of piezoelectric oscillators, wherein in the step (a), the prepared master substrate is formed with a first recess in each of the substrate regions, and wherein in the step (b), the prepared package includes a second recess and has an arrangement in which the second recess thereof accommodates therein the piezoelectric vibrator and has its aperture sealed with a closure, wherein the package is loaded from a side of the master substrate that is free from the first recess, so as to be mounted on each of the substrate regions, and wherein the IC for controlling the oscillation output of the piezoelectric vibrator is loaded from a side of the master substrate that is formed with the first recess, so as to be mounted on each of the substrate regions of the master substrate.

6. A method for manufacturing a piezoelectric oscillator comprising the steps of:

(a) preparing a master substrate partitioned into plural substrate regions;

(b) mounting, on each of the substrate regions, a package for accommodating a piezoelectric vibrator, and an IC for controlling an oscillation output of the piezoelectric vibrator; and (c) dividing the master substrate into the individual substrate regions by cutting the master substrate on outside circumferences of the individual substrate regions, thereby obtaining a plurality of piezoelectric oscillators, wherein in the step (a), the prepared master substrate is formed with a first recess in each of the substrate regions, and wherein in the step (b), the prepared package includes a second recess and has an arrangement in which the second recess thereof accommodates therein the piezoelectric vibrator and has its aperture sealed with a closure, wherein the IC for controlling the oscillation output of the piezoelectric vibrator is mounted in the first recess of each of the substrate regions of the master substrate, and wherein the package is mounted in a manner that a part of the package is located on a peripheral area of an aperture of the first recess.

7. A method for manufacturing a piezoelectric oscillator comprising the steps of:

(a) preparing a master substrate partitioned into plural substrate regions;

(b) mounting, on each of the substrate regions, a package for accommodating a piezoelectric vibrator, and an IC for controlling an oscillation output of the piezoelectric vibrator; and (c) dividing the master substrate into the individual substrate regions by cutting the master substrate on outside circumferences of the individual substrate regions, thereby obtaining a plurality of piezoelectric oscillators, wherein in the step (b), the prepared package includes a recess and has an arrangement in which the recess thereof accommodates therein the piezoelectric vibrator and has its aperture sealed with a closure, wherein the IC for controlling the oscillation output of the piezoelectric vibrator is mounted on each of the substrate regions of the master substrate, and wherein the package is mounted on the master substrate in a manner that the recess of the package encloses the piezoelectric vibrator.

8. A method for manufacturing a piezoelectric oscillator comprising the steps of:

(a) preparing a master substrate partitioned into plural substrate regions;

(b) mounting, on each of the substrate regions, a package for accommodating a quartz-crystal oscillator, and an IC for controlling an oscillation output of the quartz-crystal oscillator; and (c) dividing the master substrate into the individual substrate regions by cutting the master substrate on outside circumferences of the individual substrate regions, thereby obtaining a plurality of piezoelectric oscillators, wherein in the step (a), the prepared master substrate is provided with a throw-away region between a respective pair of adjoining substrate regions, the throw-away region including a write control terminal, wherein subsequent to the step (b), temperature compensation data used for controlling the oscillation output of the quartz-crystal oscillator based on temperature conditions thereof are written to a memory in the IC via the write control terminal, and wherein in the step (c), the throw-away region is cut off from each of the substrate regions, wherein the master substrate is formed from a resin material, whereas the package is formed from a ceramic material.

9. A method for manufacturing a piezoelectric oscillator according to claim 8, wherein in the writing step following the step (b), an electrode terminal connected with the IC is electrically connected with the write control terminal via a wiring conductor through the master substrate and a wiring conductor through a substrate included in the package.

* * * * *